United States Patent
Iguchi et al.

(10) Patent No.: US 10,686,460 B2
(45) Date of Patent: Jun. 16, 2020

(54) ANALOG-TO-DIGITAL CONVERTER, ELECTRONIC DEVICE, AND METHOD FOR CONTROLLING ANALOG-TO-DIGITAL CONVERTER

(71) Applicant: SONY SEMICONDUCTOR SOLUTIONS CORPORATION, Kanagawa (JP)

(72) Inventors: Taiki Iguchi, Kanagawa (JP); Shinichirou Etou, Kanagawa (JP); Yosuke Ueno, Kanagawa (JP); Daisuke Hirono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/325,146

(22) PCT Filed: Jul. 7, 2017

(86) PCT No.: PCT/JP2017/024944
§ 371 (c)(1),
(2) Date: Feb. 12, 2019

(87) PCT Pub. No.: WO2018/047457
PCT Pub. Date: Mar. 15, 2018

(65) Prior Publication Data
US 2019/0190526 A1    Jun. 20, 2019

(30) Foreign Application Priority Data

Sep. 6, 2016    (JP) .................................. 2016-173489

(51) Int. Cl.
*H03M 1/00* (2006.01)
*H03M 1/06* (2006.01)
(Continued)

(52) U.S. Cl.
CPC ......... *H03M 1/002* (2013.01); *H03M 1/0682* (2013.01); *H03M 1/1245* (2013.01); *H03M 1/462* (2013.01); *H03M 1/468* (2013.01)

(58) Field of Classification Search
CPC .................................................. H03M 1/1245
See application file for complete search history.

(56) References Cited

U.S. PATENT DOCUMENTS 4,633,425 A * 12/1986 Senderowicz .......... H03F 3/005
 333/166
10,084,466 B1 * 9/2018 Xavier ................ H03M 1/1245
(Continued)

FOREIGN PATENT DOCUMENTS

DE    102004016842 A1    1/2005
JP         58-020029 A    2/1983
(Continued)

OTHER PUBLICATIONS

"Single-Ended Input to Differential Output Conversion Circuit Reference Design", (ACTIVE)TIPD131, 3 pages.
(Continued)

*Primary Examiner* — Howard Williams
(74) *Attorney, Agent, or Firm* — Chip Law Group

(57) ABSTRACT

The present invention aims to reduce power consumption in an ADC that performs AD conversion of a single-ended signal. A pair of sampling capacitors samples the single-ended signal. After the single-ended signal has been sampled, the connection control unit performs positive-side connection control of connecting both ends of one of the pair of sampling capacitors across a positive-side signal line and a predetermined ground potential and performs negative-side connection control of connecting both ends of the other of the pair of sampling capacitors across a negative-side signal line and the predetermined ground potential. A conversion unit converts a differential signals from the positive-
(Continued)

side signal line and the negative-side signal line that have respectively undergone the positive-side connection control and the negative-side connection control into a digital signal.

10 Claims, 33 Drawing Sheets

(51) Int. Cl.
   *H03M 1/46* (2006.01)
   *H03M 1/12* (2006.01)

(56) References Cited

U.S. PATENT DOCUMENTS

| | | | |
|---|---|---|---|
| 2004/0201510 | A1 | 10/2004 | Tamba |
| 2010/0219864 | A1* | 9/2010 | Farhat ................. G11C 27/026 327/96 |
| 2018/0309458 | A1* | 10/2018 | Bandyopadhyay ........................ H03M 1/0854 |

FOREIGN PATENT DOCUMENTS

| | | |
|---|---|---|
| JP | 61-148910 A | 7/1986 |
| JP | 10-261962 A | 9/1998 |
| JP | 11-224496 A | 8/1999 |
| JP | 2004-312587 A | 11/2004 |
| JP | 2005-303427 A | 10/2005 |
| JP | 2015-019261 A | 1/2015 |

OTHER PUBLICATIONS

International Search Report and Written Opinion of PCT Application No. PCT/JP2017/024944, dated Sep. 26, 2017, 11 pages of ISRWO.

* cited by examiner

FIG. 22

| DACP$_n$ | DACN$_n$ | OPERATION OF CONTROL SIGNAL GENERATION UNIT |
|---|---|---|
| 0 | 0 | SIP$_n$←0<br>SIN$_n$←0<br>S2$_n$←0<br>S3$_n$←1 |
| 0 | 1 | SET S3$_n$ TO "0", SET S2$_n$ TO "1", AND THEN, PRECHARGE. AFTER PRECHARGE, SET SIN$_n$ TO "1". |
| 1 | 0 | SET S3$_n$ TO "0", SET S2$_n$ TO "1", AND THEN, PRECHARGE. AFTER PRECHARGE, SET SIP$_n$ TO "1". |

*FIG. 28*

| $DOUT_{N-1}$ | $DOUT_{N-2}$ | $CH1_{N-3}$ | $CH2_{N-3}$ | NUMBER OF CAPACITORS USED FOR PRECHARGE |
|---|---|---|---|---|
| 0 | 0 | 1 | 0 | ONE |
| 0 | 1 | 1 | 1 | TWO |
| 1 | 0 | 1 | 1 | TWO |
| 1 | 1 | 1 | 0 | ONE |

*FIG. 30*

| INPUT OF CONTROL SIGNAL GENERATION UNIT | | | $CH1_{N-4}$ | OUTPUT OF CONTROL SIGNAL GENERATION UNIT | | | NUMBER OF CAPACITORS USED FOR PRECHARGE |
|---|---|---|---|---|---|---|---|
| $DOUT_{N-1}$ | $DOUT_{N-2}$ | $DOUT_{N-3}$ | | $CH2_{N-4}$ | $CH3_{N-4}$ | $CH4_{N-4}$ | |
| 0 | 0 | 0 | 1 | 0 | 0 | 0 | ONE |
| 0 | 0 | 1 | 1 | 1 | 1 | 1 | FOUR |
| 0 | 1 | 0 | 1 | 1 | 0 | 0 | TWO |
| 0 | 1 | 1 | 1 | 1 | 1 | 0 | THREE |
| 1 | 0 | 0 | 1 | 1 | 1 | 0 | THREE |
| 1 | 0 | 1 | 1 | 1 | 0 | 0 | TWO |
| 1 | 1 | 0 | 1 | 1 | 1 | 1 | FOUR |
| 1 | 1 | 1 | 1 | 0 | 0 | 0 | ONE |

⋮

United States Patent US 10,686,460 B2

ANALOG-TO-DIGITAL CONVERTER, ELECTRONIC DEVICE, AND METHOD FOR CONTROLLING ANALOG-TO-DIGITAL CONVERTER

CROSS REFERENCE TO RELATED APPLICATIONS

This application is a U.S. National Phase of International Patent Application No. PCT/JP2017/024944 filed on Jul. 7, 2017, which claims priority benefit of Japanese Patent Application No. JP 2016-173489 filed in the Japan Patent Office on Sep. 6, 2016. Each of the above-referenced applications is hereby incorporated herein by reference in its entirety.

TECHNICAL FIELD

The present technology relates to an analog-to-digital converter, an electronic device, and a method for controlling the analog-to-digital converter. Specifically, the present invention relates to an analog-to-digital converter that performs analog-to-digital (AD) conversion on a single-ended signal, an electronic device, and a method for controlling the analog-to-digital converter.

BACKGROUND ART

Conventionally, an analog-to-digital converter (ADC) is provided for the purpose of converting an analog signal from a sensor or an antenna into a digital signal in various electronic devices that perform measurement and wireless communication. Among various types of ADCs, successive approximation register-type ADC (SARADC) is widely used due to its advantage of low power consumption and a small circuit scale.

Additionally, SARADC can be classified into a differential SARADC performing AD conversion of a differential signal and a single-ended SARADC performing AD conversion of a single-ended signal. Among them, the differential SARADC has higher symmetry between the positive-side circuit and the negative-side circuit compared with the single-ended SARADC, making it possible to suppress the noise and fluctuation of the power supply voltage. For this reason, it is desirable to perform AD conversion using a differential SARADC. However, when AD conversion is performed on a single-ended signal using a differential SARADC, it is necessary to preliminarily convert a single-ended signal into a differential signal by using a single-ended-to-differential conversion circuit. For example, there is proposed a single-ended-to-differential conversion circuit that performs conversion to a differential signal by a circuit provided with two stages of operational amplifiers, resistors, and the like (for example, refer to Non-Patent Document 1).

CITATION LIST

Non-Patent Document

Non-Patent Document 1: Single Supply Single-Ended Input to Differential Output", [online], Texas Instruments Incorporated, [Search on Aug. 10, 2016], Internet (URL: http://www.tij.co.jp/tool/jp/TIPD131)

SUMMARY OF THE INVENTION

Problems to be Solved by the Invention

By adding the single-ended-to-differential conversion circuit described above to a preceding stage of the differential SARADC, it would be possible to perform AD conversion of a single-ended signal by using a differential SARADC with relatively good characteristics. However, addition of the above-described single-ended-to-differential conversion circuit would lead to a problem of an increase in power consumption than the time before the addition.

The present technology has been developed in view of such a situation, and aims to reduce power consumption in an ADC that performs AD conversion of a single-ended signal.

Solutions to Problems

The present technology is intended to solve the above-described problem and a first aspect of the present technology is an analog-to-digital converter including: a pair of sampling capacitors that samples a single-ended signal; a connection control unit that, after the single-ended signal has been sampled, performs positive-side connection control of connecting both ends of one of the pair of sampling capacitors across a positive-side signal line and a predetermined terminal and performs negative-side connection control of connecting both ends of the other of the pair of sampling capacitors across a negative-side signal line and the predetermined terminal; and a conversion unit that converts a differential signal from the positive-side signal line and the negative-side signal line that have respectively undergone the positive-side connection control and the negative-side connection control into a digital signal, and a method for controlling the analog-to-digital converter. This achieves an effect that the single-ended signal can be converted into a differential signal.

Furthermore, in the first aspect, it is allowable to further include a pair of common voltage generating capacitors charged with a predetermined internal potential, in which the pair of sampling capacitors samples the single-ended signal in a state where the capacitor is connected in parallel between the positive-side signal line and the negative-side signal line, the positive-side connection control may be a control of switching a connection destination of one end of the one of the pair of sampling capacitors from the negative-side signal line to the predetermined terminal and switching a connection destination of one end of the one of the pair of common voltage generating capacitors from the predetermined internal potential to the positive-side signal line, and the negative-side connection control may be a control of switching a connection destination of one end of the other of the pair of sampling capacitors from the positive-side signal line to the predetermined terminal and switching a connection destination of one end of the other of the pair of common voltage generating capacitors from the predetermined internal potential to the negative-side signal line. This achieves an effect that the single-ended signal can be converted into a differential signal by a circuit symmetrical between the positive side and the negative side.

Furthermore, in the first aspect, the connection control unit may switch the connection destination of the one end of the other of the pair of sampling capacitors at a timing different from the one of the pair of sampling capacitors. This achieves an effect that the connection destinations of the pair of sampling capacitors can be switched at mutually different timings.

Furthermore, in the first aspect, it is allowable to further include a pair of common voltage generating capacitors charged with a potential of the negative-side signal line, in which the one of the pair of sampling capacitors samples the single-ended signal in a state where the both ends are connected to the positive-side signal line and the predetermined terminal, the other of the pair of sampling capacitors samples the single-ended signal in a state where the both ends are connected to the positive-side signal line and the predetermined internal potential, the positive-side connection control may be a control of switching a connection destination of one end of one of the pair of common voltage generating capacitors from the negative-side signal line to the positive-side signal line, and the negative-side connection control may be a control of switching a connection destination of one end of the other of the pair of sampling capacitors from the positive-side signal line to the predetermined terminal and switching a connection destination of the other end of the other of the pair of sampling capacitors from the predetermined internal potential to the negative-side signal line. This achieves an effect that the single-ended signal can be converted into a differential signal by a circuit having relatively small numbers of switches.

Furthermore, it is allowable in the first aspect to further include: a decoupling capacitor that supplies a reference potential higher than a predetermined ground potential via a reference signal line; a digital-to-analog converter control unit that generates a control signal of instructing switching a connection destination of one end of any of the pair of sampling capacitors from one of the reference potential and the ground potential to the other on the basis of the digital signal; a charge control unit that outputs the control signal after charging at least one of the decoupling capacitors or the reference signal line in a case where the control signal has been generated; and a switch that switches a connection destination of the one end of any of the pair of sampling capacitors in accordance with the output control signal. This achieves an effect that at least one of the decoupling capacitor or the reference signal line can be charged before the control signal is output.

Furthermore, in the first aspect, the charge control unit may charge at least one of the decoupling capacitor or the reference signal line with a constant charging amount. This achieves an effect that it is possible to perform charging with a constant charging amount.

Furthermore, in the first aspect, the charge control unit may control the charging amount in charging at least one of the decoupling capacitor or the reference signal line on the basis of the digital signal. This achieves an effect that the charging amount can be controlled on the basis of the digital signal.

Furthermore, in the first aspect, the single-ended signal may be input to a top plate of the pair of sampling capacitors. This achieves an effect that top plate sampling is performed.

Furthermore, in the first aspect, the single-ended signal may be input to bottom plates of the pair of sampling capacitors. This achieves an effect that bottom plate sampling is performed.

Furthermore, a second aspect of the present technology is an electronic device including: a pair of sampling capacitors that samples a single-ended signal; a connection control unit that, after the single-ended signal has been sampled, performs positive-side connection control of connecting both ends of one of the pair of sampling capacitors across a positive-side signal line and a predetermined terminal and performs negative-side connection control of connecting both ends of the other of the pair of sampling capacitors across a negative-side signal line and the predetermined terminal; and a conversion unit that converts a differential signal from the positive-side signal line and the negative-side signal line that have respectively undergone the positive-side connection control and the negative-side connection control into a digital signal; and a digital signal processing unit that processes the digital signal. This achieves an effect that the single-ended signal can be converted into a differential signal, and the digital signal obtained by converting the differential signal is processed.

Effects of the Invention

According to the present technology, it is possible to achieve an excellent effect that power consumption can be reduced in an ADC that performs AD conversion of a single-ended signal. Note that effects described herein are non-restricting. The effects may be any of effects described in the present disclosure.

BRIEF DESCRIPTION OF DRAWINGS

FIG. 22 is a diagram illustrating an example of operation of the control signal generation unit according to the second embodiment of the present technology.

FIG. 28 is a diagram illustrating an example of operation of a control signal generation unit corresponding to the (N−3)th bit according to the third embodiment of the present technology.

FIG. 30 is a diagram illustrating an example of operation of a control signal generation unit corresponding to the (N−4)th bit according to the third embodiment of the present technology.

MODE FOR CARRYING OUT THE INVENTION

Hereinafter, embodiments of the present technology (hereinafter, embodiment(s)) will be described. The description will be given in the following order.

1. First Embodiment (example of single-ended-to-differential conversion)
2. Second Embodiment (example of single-ended-to-differential conversion and precharge)
3. Third Embodiment (example of single-ended-to-differential conversion and precharge with charging amount corresponding to digital signal)

1. First Embodiment

[Configuration Example of Electronic Device]

Figure 1:
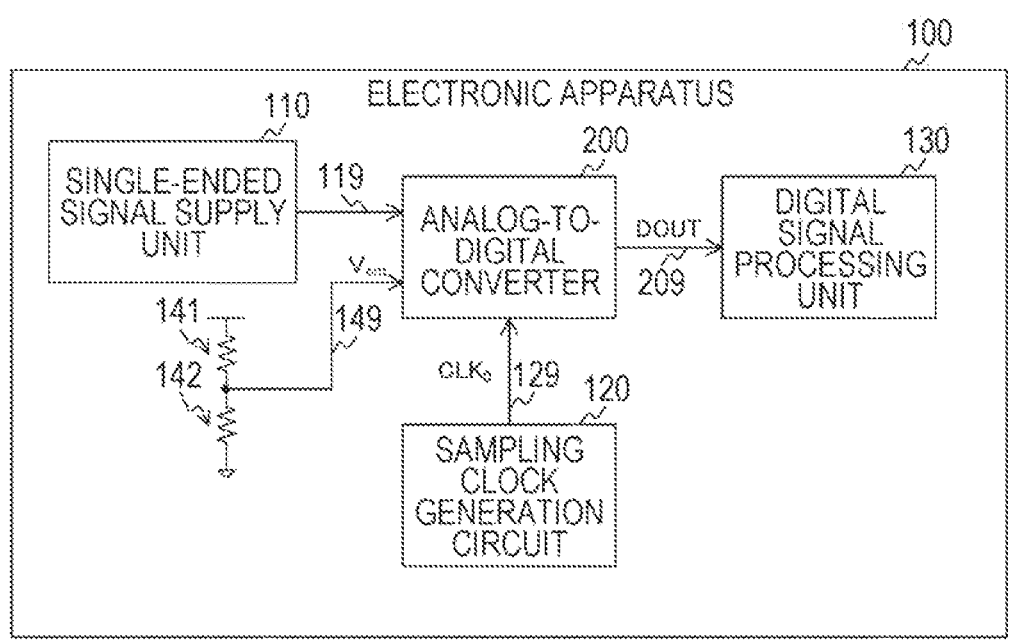
FIG. 1 is a block diagram illustrating a configuration example of an electronic device according to a first embodiment of the present technology.

FIG. 1 is a block diagram illustrating a configuration example of an electronic device 100 according to a first embodiment of the present technology. The electronic device 100 is a device that processes a digital signal and includes a single-ended signal supply unit 110, a sampling clock generation circuit 120, a digital signal processing unit 130, resistors 141 and 142, and an analog-to-digital converter 200. A device used for a sensing application is assumed as the electronic device 100. Note that in addition to the sensing application, the analog-to-digital converter 200 may also be provided in a receiving device that receives a wireless signal, an imaging device that captures an image signal, or the like.

The single-ended signal supply unit 110 generates an analog single-ended signal and supplies the generated signal to the analog-to-digital converter 200 via a signal line 119. An assumable example of this single-ended signal supply unit 110 is a sensor or the like.

The resistors 141 and 142 are connected in series between a power supply terminal and a ground terminal. The connection point of these resistors 141 and 142 is connected to the analog-to-digital converter 200 via a signal line 149.

The sampling clock generation circuit 120 generates a clock signal of a predetermined frequency as a sampling clock $CLK_0$. The sampling clock generation circuit 120 supplies the generated sampling clock $CLK_0$ to the analog-to-digital converter 200 via the signal line 129.

The analog-to-digital converter 200 AD converts a single-ended signal to a digital signal DOUT in synchronization with the sampling clock $CLK_0$. The analog-to-digital converter 200 supplies the converted digital signal DOUT to the digital signal processing unit 130 via the signal line 209.

The digital signal processing unit 130 processes the digital signal DOUT. For example, analysis of a digital signal from a sensor or the like is executed.

[Configuration Example of Analog-To-Digital Converter]

Figure 2:
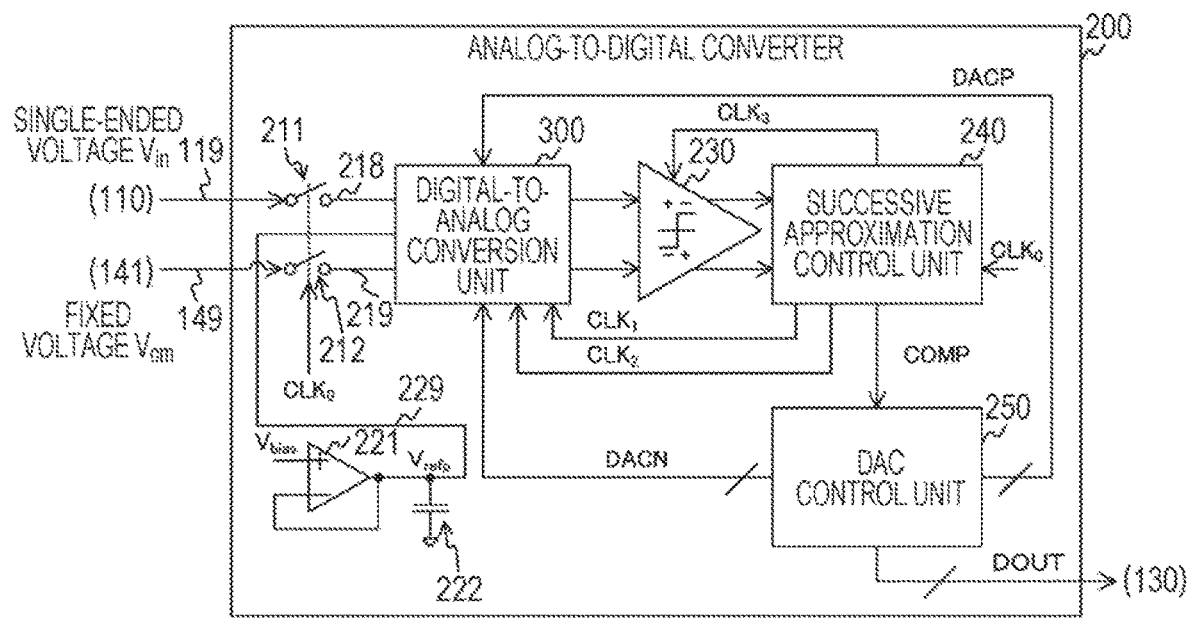
FIG. 2 is a block diagram illustrating a configuration example of an analog-to-digital converter according to the first embodiment of the present technology.

FIG. 2 is a block diagram illustrating a configuration example of the analog-to-digital converter 200 according to the first embodiment of the present technology. The analog-to-digital converter 200 includes sampling switches 211 and 212, a reference buffer 221, a decoupling capacitor 222, and a digital-to-analog conversion unit 300. Furthermore, the analog-to-digital converter 200 includes a comparator 230, a successive approximation control unit 240, and a DAC control unit 250.

The sampling switch 211 opens and closes a path between the signal line 119 and the positive-side signal line 218 in synchronization with the sampling clock $CLK_0$. The sampling switch 212 opens and closes a path between the signal line 149 and the negative-side signal line 219 in synchronization with the sampling clock $CLK_0$. The sampling switches 211 and 212, for example, shift to the closed state in a case where the sampling clock $CLK_0$ is at a high level, and shift to the open state in a case where the sampling clock $CLK_0$ is at a low level.

The reference buffer 221 generates a positive reference voltage $V_{refp}$ from a predetermined bias voltage $V_{bias}$. A bias voltage $V_{bias}$ is input to a non-inverting input terminal (+) of the reference buffer 221. Furthermore, an output terminal of the reference buffer 221 is connected to its inverting input terminal (−), one end of the decoupling capacitor 222, and the digital-to-analog conversion unit 300. The reference buffer 221 generates the reference voltage $V_{refp}$ from the bias voltage $V_{bias}$ and outputs the reference voltage $V_{refp}$ from the output terminal.

The decoupling capacitor 222 holds the reference voltage $V_{refp}$ and supplies the held voltage to the digital-to-analog conversion unit 300 via the reference signal line 229. The decoupling capacitor 222 is provided for the purpose of suppressing fluctuation of the reference voltage $V_{refp}$, for example.

The digital-to-analog conversion unit 300 controls voltage of either the positive-side signal line 218 or the negative-side signal line 219 in accordance with control signals DACP and DACN. A single-ended signal, control signals DACP and DACN, and switching control clocks $CLK_1$ and $CLK_2$ are input to the digital-to-analog conversion unit 300. The digital-to-analog conversion unit 300 converts the single-ended signal into a differential signal in synchronization with the switching control clocks $CLK_1$ and $CLK_2$, and supplies the differential signal to the comparator 230. Details of converting method will be described later.

Next, the digital-to-analog conversion unit 300 increases or decreases the positive voltage of the differential signal in accordance with the control signal DACP. In addition, the digital-to-analog conversion unit 300 increases or decreases the negative voltage of the differential signal in accordance with the control signal DACN.

The comparator 230 compares the positive voltage and the negative voltage of the differential signal. The comparator 230 compares the positive voltage and the negative voltage in synchronization with a successive approximation control clock $CLK_3$, and supplies a comparison result to the successive approximation control unit 240. For example, a comparison result being either a high level or a low level is generated depending on whether or not the positive voltage is higher than the negative voltage. Note that the comparator 230 is an example of a conversion unit described in the claims.

The successive approximation control unit 240 generates the switching control clocks $CLK_1$ and $CLK_2$ and the successive approximation control clock $CLK_3$ in synchronization with the sampling clock $CLK_0$. The successive approximation control unit 240 supplies the switching control clocks $CLK_1$ and $CLK_2$ to the digital-to-analog conversion unit 300 and supplies the successive approximation control clock $CLK_3$ to the comparator 230. Furthermore, the successive approximation control unit 240 supplies a comparison result COMP of the comparator 230 to the DAC control unit 250.

The DAC control unit 250 generates the control signals DACP and DACN on the basis of the comparison result COMP. In addition, the DAC control unit 250 generates a digital signal DOUT including N (N is an integer) comparison results COMP and supplies the digital signal DOUT to the digital signal processing unit 130.

[Configuration Example of Digital-To-Analog Conversion Unit]

Figure 3:
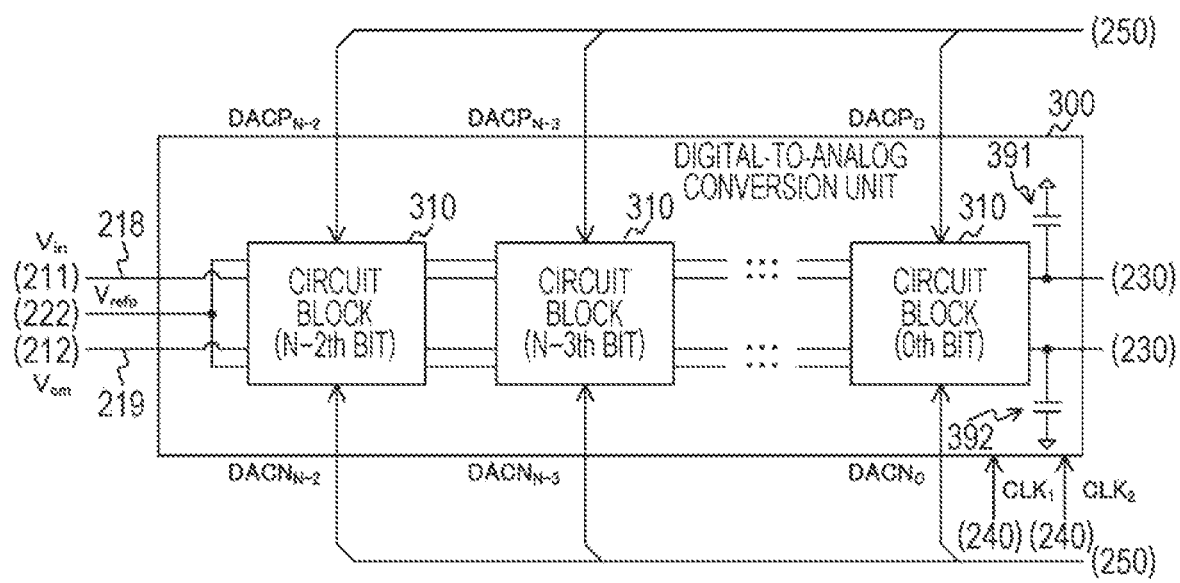
FIG. 3 is a block diagram illustrating a configuration example of a digital-to-analog conversion unit according to the first embodiment of the present technology.

FIG. 3 is a block diagram illustrating a configuration example of the digital-to-analog conversion unit 300 according to the first embodiment of the present technology. This digital-to-analog conversion unit 300 includes N−1 circuit blocks 310 and capacitors 391 and 392. Furthermore, each of the control signals DACP and DACN is a digital signal of N−1 bits. An n-th bit $DACP_n$ (n is an integer from 0 to N−2) of the control signal DACP is input to the n-th circuit block 310, and the n-th bit $DACN_n$ of the control signal DACN is input to the n-th circuit block 310. Furthermore, the switching control clocks $CLK_1$ and $CLK_2$ and the reference voltage $V_{refp}$ are input to all the circuit blocks 310.

Both ends of the capacitor 391 are connected to the positive-side signal line 218 and the ground terminal of a predetermined ground potential. Furthermore, both ends of the capacitor 392 are connected to the negative-side signal line 219 and the ground terminal.

The circuit block 310 increases or decreases the voltage of either the positive-side signal line 218 or the negative-side signal line 219 in accordance with the bits $DACP_n$ and $DACN_n$.

[Configuration Example of Circuit Block]

Figure 4:
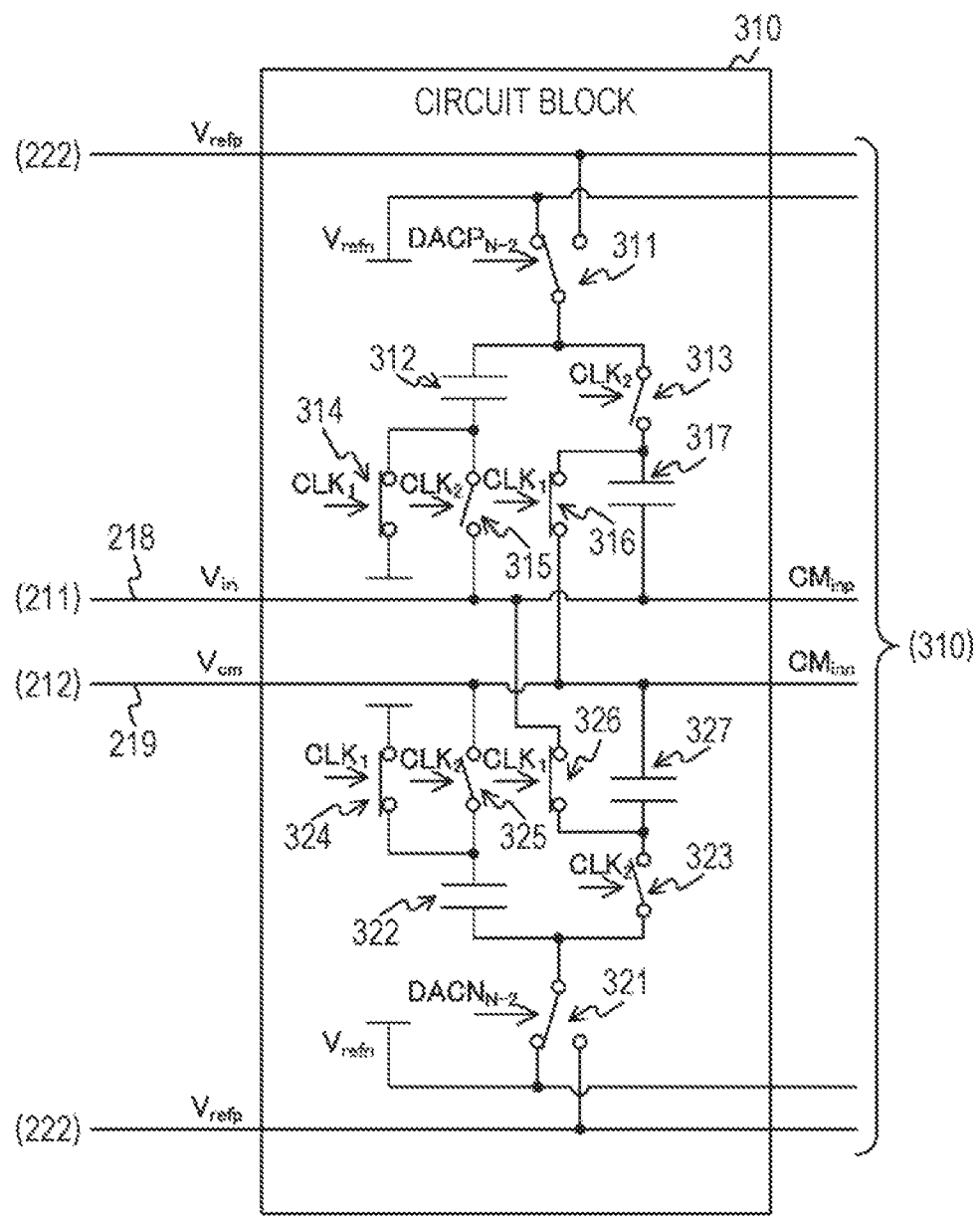
FIG. 4 is a circuit diagram illustrating a configuration example of a circuit block according to the first embodiment of the present technology.

FIG. 4 is a circuit diagram illustrating a configuration example of a circuit block 310 according to the first embodiment of the present technology. This circuit block 310 includes switches 311, 313, 314, 315, 316, 321, 323, 324, 325 and 326. These switches are implemented by Metal-Oxide-Semiconductor (MOS) transistors, for example.

Furthermore, the circuit block 310 also includes common voltage generating capacitors 312 and 322 and sampling capacitors 317 and 327. While a general structure SARADC includes a pair of sampling capacitors every N−1 digit digits, the circuit block 310 further includes a pair of common voltage generating capacitors 312 and 322 for every digit.

The capacitances of the four capacitors of the common voltage generating capacitors 312 and 322 and the sampling capacitors 317 and 327 are the same. Furthermore, the capacitances of the capacitors of the N−1 circuit blocks 310 are mutually different. For example, assuming that the capacitance of the capacitor of the circuit block 310 corresponding to the n-th bit is $C_n$, the capacitance $C_n$ would be twice the capacitance $C^{n-1}$, for example.

The switch 311 connects either of the negative-side reference signal line to which the negative reference voltage $V_{refn}$ is applied or the positive-side reference signal line of the reference voltage $V_{refp}$ to the common terminal of the common voltage generating capacitor 312 and the switch 313, in accordance with the control signal $DACP_n$. For example, the negative-side reference signal line is connected in a case where the control signal $DACP_n$ is at a low level, and the positive-side reference signal line is connected in a case where the control signal $DACP_n$ is at a high level. Note that a ground line connected to the ground may be provided in place of the negative-side reference signal line.

The switch 321 connects either the negative-side reference signal line or the positive-side reference signal line to the common terminal of the common voltage generating capacitor 322 and the switch 323 in accordance with the control signal $DACN_n$. For example, the negative-side reference signal line is connected in a case where the control signal $DACN_n$ is at a low level, and the positive-side reference signal line is connected in a case where the control signal $DACN_n$ is at a high level.

One end of the common voltage generating capacitor 312 is connected to the switch 311, and the other end is commonly connected to the switches 314 and 315. One end of the common voltage generating capacitor 322 is connected to the switch 321, and the other end is commonly connected to the switches 324 and 325.

The switch 314 opens and closes the path between the power supply terminal of a predetermined internal voltage $V_{cp}$ and the capacitor 312 in accordance with the switching control clock $CLK_1$. For example, the switch 314 shifts to the closed state in a case where the switching control clock $CLK_1$ is at the high level, and shifts to the open state in a case where the switching control clock $CLK_1$ is at the low level. Similarly, the other switches 313, 315, 316, 323, 324, 325, and 326 shift to the closed state in a case where the switching control clock is at a high level, and shift to the open state in a case where the switching control clock is at a low level.

The switch 324 opens and closes the path between the power supply terminal of a predetermined internal voltage $V_{cn}$ and the common voltage generating capacitor 322 in accordance with the switching control clock $CLK_1$.

The switch 315 opens and closes a path between the positive-side signal line 218 and the common voltage generating capacitor 312 in accordance with the switching control clock $CLK_2$. The switch 325 opens and closes a path between the negative-side signal line 219 and the common voltage generating capacitor 322 in accordance with the switching control clock $CLK_2$.

One end of the sampling capacitor 317 is connected to the positive-side signal line 218, and the other end is commonly connected to the switches 313 and 316. Furthermore, one end of the sampling capacitor 327 is connected to the negative-side signal line 219, and the other end is commonly connected to the switches 323 and 326.

The switch 313 opens and closes the path between the switch 311 and the sampling capacitor 317 in accordance with the switching control clock $CLK_2$. The switch 323 opens and closes the path between the switch 321 and the sampling capacitor 327 in accordance with the switching control clock $CLK_2$.

The switch 316 opens and closes a path between the negative-side signal line 219 and the sampling capacitor 317 in accordance with the switching control clock $CLK_1$. The switch 326 opens and closes the path between the positive-side signal line 218 and the sampling capacitor 327 in accordance with the switching control clock $CLK_1$.

Figure 5:
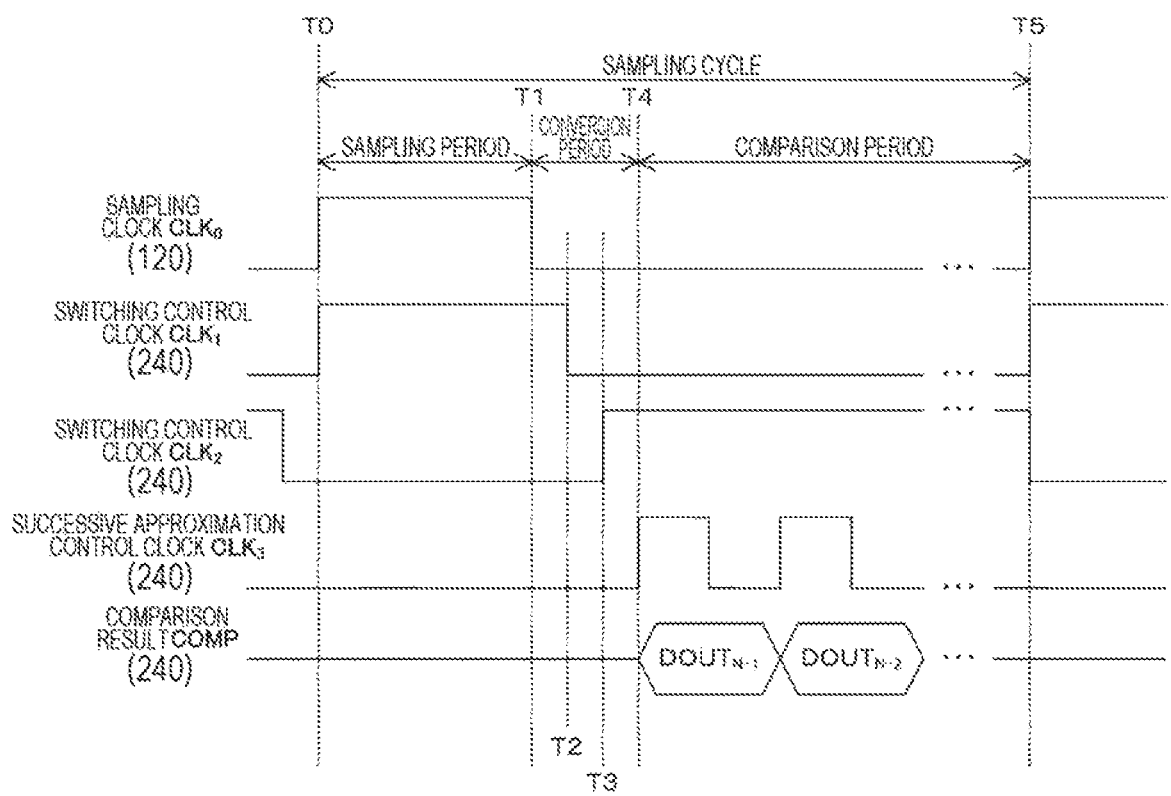
FIG. 5 is a timing chart illustrating an example of operation of the analog-to-digital converter according to the first embodiment of the present technology.

FIG. 5 is a timing chart illustrating an example of operation of the analog-to-digital converter 200 according to the first embodiment of the present technology. The sampling cycle which is the reciprocal of the frequency of the sampling clock $CLK_0$ is divided into a sampling period, a conversion period, and a comparison period.

The sampling period is a period for sampling the single-ended signal. Assuming that the sampling cycle is from timing T0 to timing T5, the sampling clock generation circuit 120 sets the sampling clock $CLK_0$ to the high level in the sampling period from timing T0 to timing T1. In addition, in the sampling period, the successive approximation control unit 240 controls the switching control clock $CLK_1$ to a high level and controls the switching control clock $CLK_2$ and the successive approximation control clock $CLK_3$ to low levels. Through these controls, single-ended signals are sampled.

The sampling clock generation circuit 120 then sets the sampling clock $CLK_0$ to the low level at the start point (T1) of the conversion period of timing T1 to the timing T4. Next, the successive approximation control unit 240 controls the switching control clock $CLK_1$ to the low level at timing T2, and controls the switching control clock $CLK_2$ to the high level at the subsequent timing T3. Through these controls, the single-ended signal is converted into a differential signal.

Subsequently, the successive approximation control unit 240 supplies the successive approximation control clock $CLK_3$ having a higher frequency than the sampling clock $CLK_0$ over the comparison period of timing T4 to timing T5. In synchronization with the successive approximation control clock $CLK_3$, the comparator 230 generates a comparison result COMP of either a high level or a low level. The n-th comparison result COMP is output as the n-th bit of DOUT of the digital signal. For example, the (N−1)th bit is output first and the 0-th bit is output last.

Figure 6:
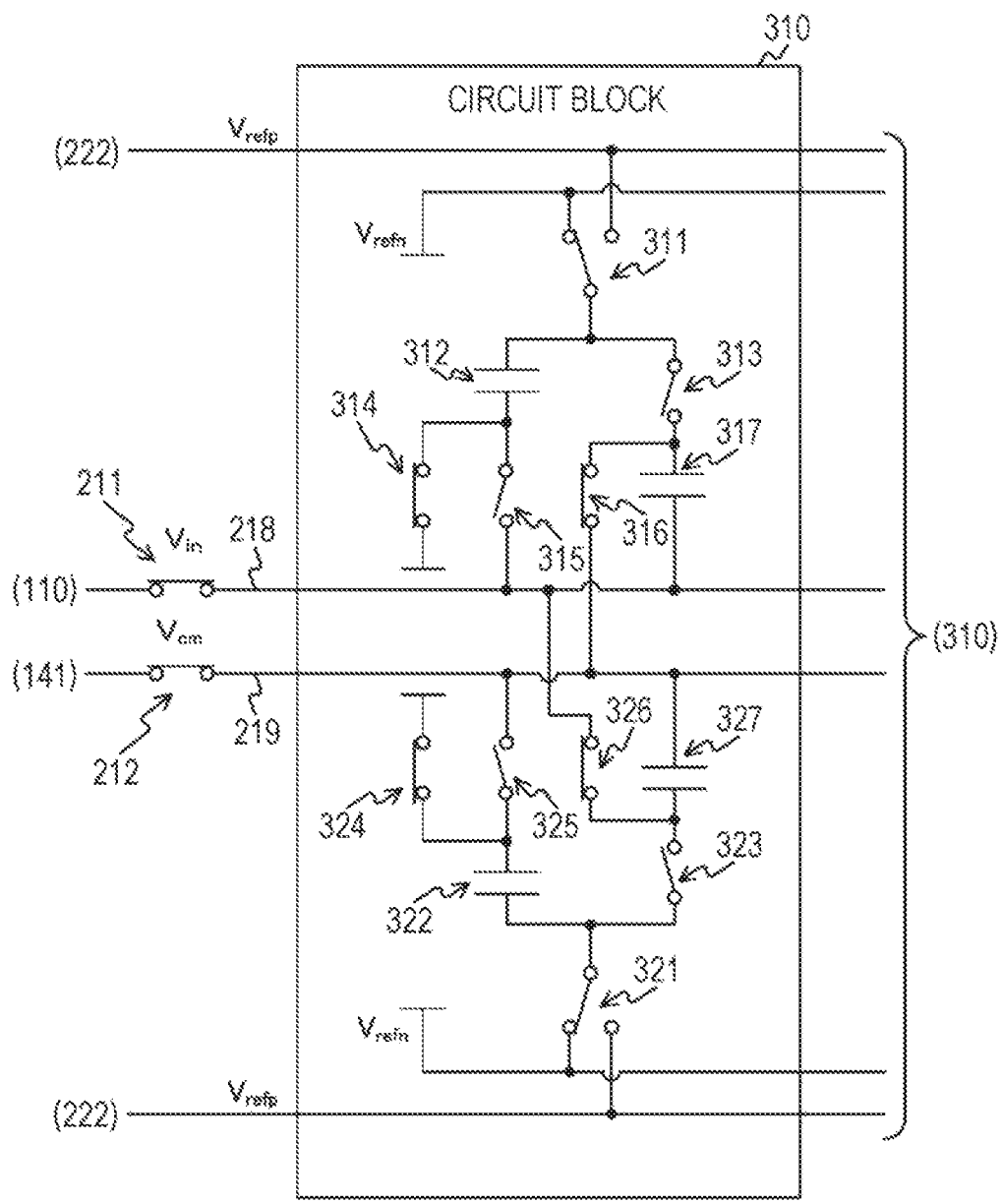
FIG. 6 is a diagram illustrating an example of states of a sampling switch and a circuit block within a sampling period in the first embodiment of the present technology.

FIG. 6 is a diagram illustrating an example of states of a sampling switch and the circuit block 310 within a sampling period in the first embodiment of the present technology. Here, it is assumed that the control signals $DACP_n$ and $DACN_n$ are set to the low level in an initial state. Therefore, in the switches 311 and 321, the connection destination of the terminal is the negative-side reference signal line.

In the sampling period, the sampling switches 211 and 212 are both shifted to the closed state by the high level sampling clock $CLK_0$.

In addition, the switches 314 and 324 and the switches 316 and 326 shift to the closed state by the high level switching control clock $CLK_1$. Moreover, the switches 313 and 323 and the switches 315 and 325 are shifted to the open state by the high level switching control clock $CLK_2$.

Through these controls, the sampling capacitors 317 and 327 are connected in parallel between the positive-side signal line 218 and the negative-side signal line 219, and single-ended signals are sampled to these capacitors. Here, since the single-ended signal is input to the positive-side signal line 218, a single-ended voltage $V_{in}$ of that signal is applied. In contrast, a fixed voltage $V_{cm}$ is applied to the negative-side signal line 218. Furthermore, the both of the capacitances of the sampling capacitors 317 and 327 on the positive side are $C_n$. Therefore, the charge amount $Q_s$ held in each of the positive-side sampling capacitors 317 and 327 is expressed by the following formula.

$$Q_s = C_n \times (V_{in} - V_{cm}) \quad \text{Formula 1}$$

In addition, when both the control signals $DACP_n$ and $DACN_n$ are at low level, each of the switches 311 and 321 switches the connection destination to the negative-side reference signal line. Furthermore, the positive-side common voltage generating capacitor 312 is charged with the predetermined internal voltage $V_{cp}$, and the negative-side common voltage generating capacitor 322 is charged with the predetermined internal voltage $V_{cn}$. If these internal voltages $V_{cn}$ and $V_{cp}$ are different values, the charge amount to be charged by the common voltage generating capacitor 312 and the common voltage generating capacitor 322 would be different values, leading to necessity to perform separate calculation. To avoid this and to simplify the calculation, it is assumed that both the internal voltages $V_{cp}$ and $V_{cn}$ are the power supply voltage VDD. In this case, since the power supply voltage VDD is applied to both the common voltage generating capacitors 312 and 322 of the capacitance $C_n$, the charge amount held in the common voltage generating capacitors 312 and 322 is expressed by the following formulas. Here, the negative reference voltage $V_{refn}$ is assumed to be about 0 volt (V).

$$Q_{cm} = C_n \times VDD \quad \text{Formula 2}$$

In the above Formula, $Q_{cm}$ is the charge amount held in the common voltage generating capacitor 312 or 322.

Figure 7:
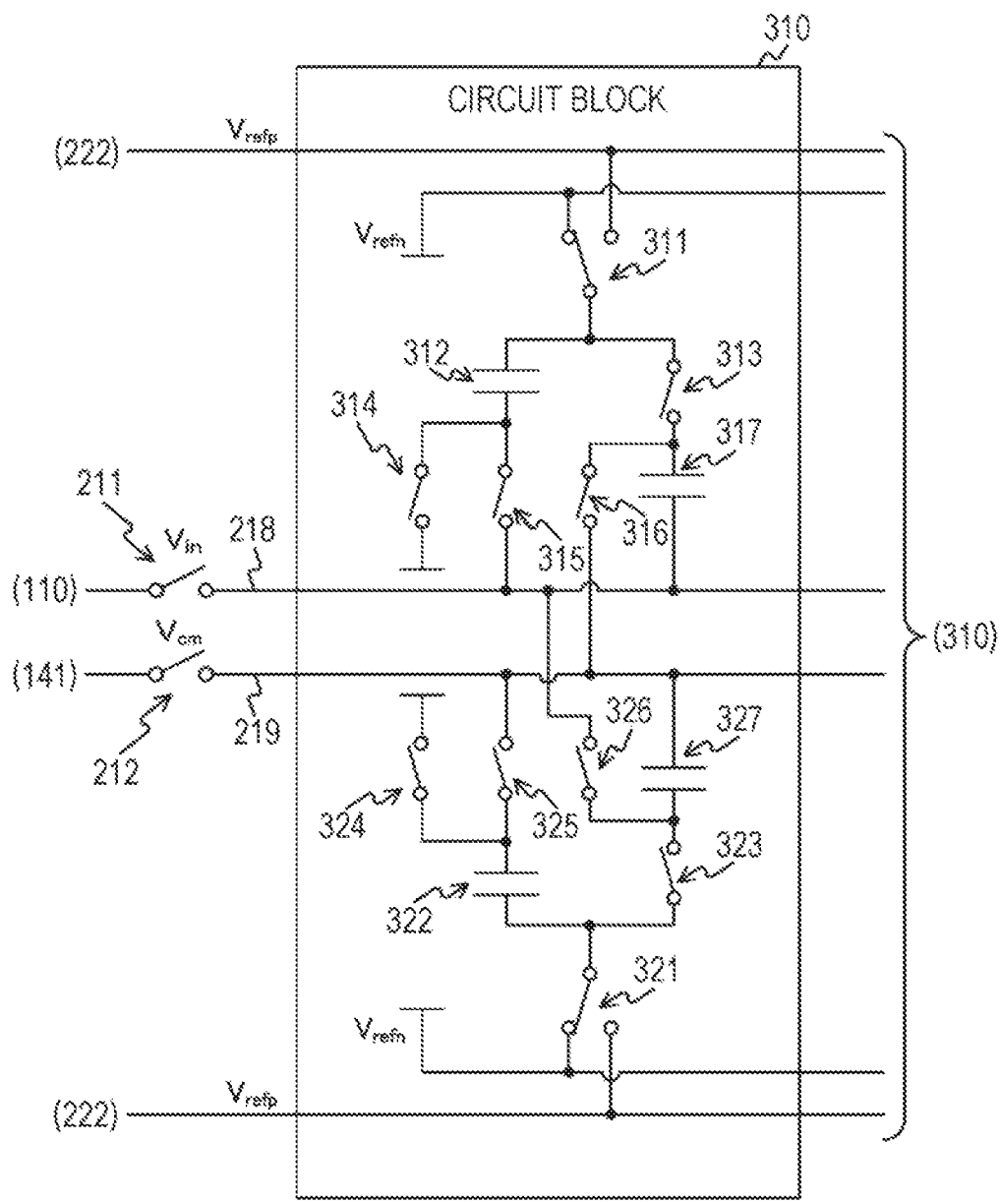
FIG. 7 is a diagram illustrating an example of states of a sampling switch and a circuit block immediately before single-ended-to-differential conversion in the first embodiment of the present technology.

FIG. 7 is a diagram illustrating an example of states of a sampling switch and the circuit block 310 immediately before single-ended-to-differential conversion in the first embodiment of the present technology. During the conversion period, all the sampling clock $CLK_0$ and the switching control clocks CLK$_1$ and CLK$_2$ are controlled to the low level. As a result, all the switches are shifted to the open state.

Figure 8:
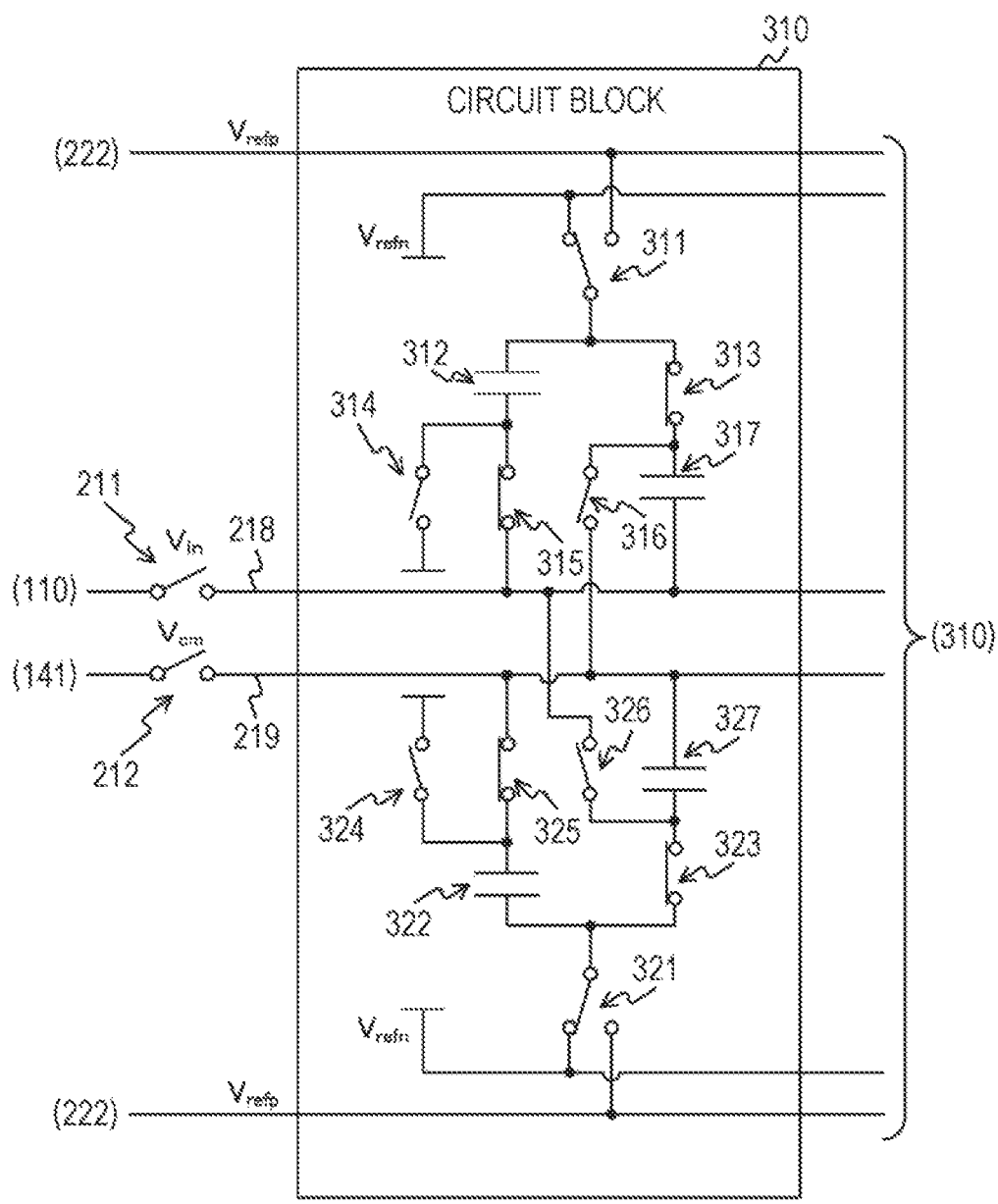
FIG. 8 is a diagram illustrating an example of states of a sampling switch and a circuit block after single-ended-to-differential conversion in the first embodiment of the present technology.

FIG. 8 is a diagram illustrating an example of states of a sampling switch and the circuit block 310 after single-ended-to-differential conversion in the first embodiment of the present technology. The switches 314 and 324 and the switches 316 and 326 are shifted to the open state by the low level switching control clock CLK$_1$.

In addition, the switches 313 and 323 and the switches 315 and 325 are shifted to the closed state by the high level switching control clock CLK$_2$.

Through these controls, the connection destination of one end (positive electrode) of the common voltage generating capacitor 312 is switched from the power supply terminal to the positive-side signal line 218. The connection destination of one end (negative electrode) of the sampling capacitor 317 is switched from the negative-side signal line 219 to the switch 311 and the common voltage generating capacitor 312.

Furthermore, the connection destination of one end (positive electrode) of the common voltage generating capacitor 322 is switched from the power supply terminal to the negative-side signal line 219. The connection destination of one end (positive electrode) of the sampling capacitor 327 is switched from the positive-side signal line 218 to the switch 321 and the common voltage generating capacitor 322.

The charge amounts held in the positive-side common voltage generating capacitor 312 and the sampling capacitor 317 after the switching are expressed by the following formulas on the basis of Formulas 1 and 2 since the negative electrodes of these capacitors are connected to each other.

$$Q_{cm}+Q_s=C_n \times VDD+C_n \times (V_{in}-V_{cm}) \quad \text{Formula 3}$$

Since the combined capacitance of the common voltage generating capacitor 312 and the sampling capacitor 317 connected in parallel is $2C_n$, the positive voltage $CM_{inp}$ which is the voltage of the positive-side signal line 218 is expressed by the following Formula on the basis of Formula 3.

$$CM_{inp}=(Q_{cm}+Q_s)/(2C_n)=(VDD+V_{in}-V_{cm})/2 \quad \text{Formula 4}$$

Meanwhile, in switching of connection, the positive electrode of the negative-side sampling capacitor 327 is to be connected to the negative electrode of the common voltage generating capacitor 322. In other words, the positive electrode and the negative electrode of the sampling capacitor 327 are connected in reverse. Accordingly, the charge amount to be held in the common voltage generating capacitor 322 and the sampling capacitor 327 after the switching is expressed by the following formula on the basis of Formulas 1 and 2.

$$Q_{cm}-Q_s=C_n \times VDD-C_n \times (V_{in}-V_{cm}) \quad \text{Formula 5}$$

Since the combined capacitance of the common voltage generating capacitor 322 and the sampling capacitor 327 connected in parallel is $2C_n$, the negative voltage $CM_{inn}$ being the voltage of the negative-side signal line 219 is expressed by the following formula on the basis of Formula 5.

$$CM_{inn}=(Q_{cm}-Q_s)/(2C_n)=(VDD+V_{cm}-V_{in})/2 \quad \text{Formula 6}$$

Here, assuming that the common voltage of the single-ended signal is $V_{in\_cm}$ and the voltage of a small signal component based on the common voltage is $v_{in}$, the single-ended voltage $V_{in}$ would be expressed by the following formula.

$$V_{in}=v_{in}+V_{in\_cm} \quad \text{Formula 7}$$

Substituting Formula 7 into Formulas 4 and 6 yields the following formula. Here, $V_{cm}$ represents a predetermined fixed voltage applied to the negative-side signal line 219.

$$CM_{inp}=v_{in}/2+(VDD+V_{in\_cm}-V_{cm})/2 \quad \text{Formula 8}$$

$$CM_{inn}=-v_{in}/2+(VDD+V_{cm}-V_{in\_cm})/2 \quad \text{Formula 9}$$

Here, assuming that the fixed voltage $V_{cm}$ is substantially the same value as the common voltage $V_{in\_cm}$, Formulas 8 and 9 can be simplified to the following Formulas, respectively.

$$CM_{inp}=v_{in}/2+VDD/2 \quad \text{Formula 10}$$

$$CM_{inn}=-v_{in}/2+VDD/2 \quad \text{Formula 11}$$

As seen from Formulas 10 and 11, the signals being the positive voltage $CM_{inp}$ and the negative voltage $CM_{inn}$ are differential signals with the common voltage being VDD/2.

Note that although the fixed voltage $V_{cm}$ is set to substantially the same value as the common voltage $V_{in\_cm}$, the fixed voltage $V_{cm}$ and the common voltage $V_{in\_cm}$ may be set to values other than substantially the same value. In that case, differential signals represented by Formulas 8 and 9 would be obtained.

Figures 9A, 9B:
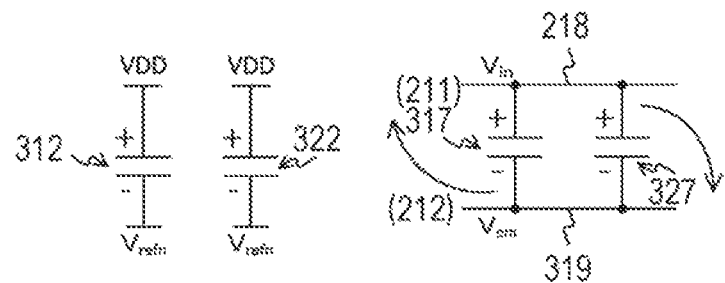
FIGS. 9A, 9B, and 9C are diagrams illustrating a connection configuration example of capacitors before and after single-ended-to-differential conversion in the first embodiment of the present technology.
Figure 9C:
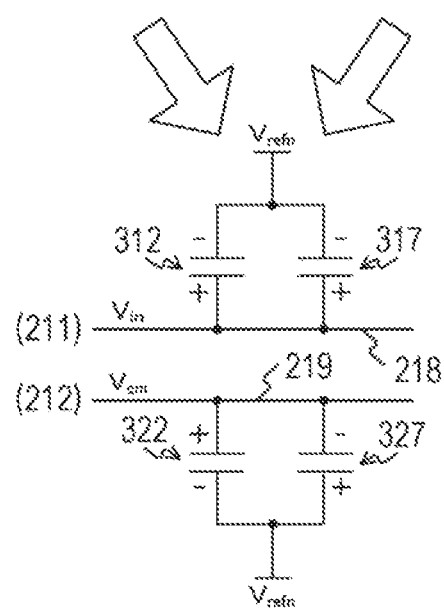

FIGS. 9A, 9B, and 9C are diagrams illustrating an example of a connection configuration of capacitors before and after single-ended-to-differential conversion according to the first embodiment of the present technology. In the figure, various switches such as the switch 311 are omitted for convenience of description FIG. 9A is a diagram illustrating a connection configuration example of the common voltage generating capacitors 312 and 322 at the start of the conversion period. Both of these capacitors are charged by internal voltage (such as power supply voltage VDD).

Furthermore, FIG. 9B is a diagram illustrating a connection configuration example of the sampling capacitors 317 and 327 at the start of the conversion period. These capacitors are connected in parallel between the positive-side signal line 218 and the negative-side signal line 219. For this reason, all of these capacitors are charged by Vin-Vcm. In other words, the single-ended signal is sampled.

FIG. 9C illustrates a connection configuration example of each of capacitors when the connection of each of the capacitors is switched during the conversion period. The connection destination of the negative electrode of the positive-side sampling capacitor 317 is switched from the negative-side signal line 219 to the negative electrode of the common voltage generating capacitor 312 and the negative-side reference signal line. Furthermore, the connection destination of the positive electrode of the common voltage generating capacitor 312 is switched from the power supply voltage VDD to the positive-side signal line 218.

In contrast, unlike the positive side, the connection destination of the positive electrode in the negative-side sampling capacitor 327 is switched from the positive-side signal line 218 to the negative electrode of the common voltage generating capacitor 322 and the negative-side reference signal line. Furthermore, the connection destination of the positive electrode of the common voltage generating capacitor 322 is switched from the power supply voltage VDD to the negative-side signal line 219.

With execution of this switching control, the common voltage generating capacitor 312 and the sampling capacitor 317 are connected in parallel to the positive-side signal line 218, on the positive side. In contrast, on the negative side, the common voltage generating capacitor 322 and the sampling capacitor 327 are connected in parallel to the negative-side signal line 219. Note that while the positive electrode of the sampling capacitor 317 is connected to the positive-side signal line 218 on the positive side, negative electrode of the sampling capacitor 327 is connected to the negative-side signal line 219 on the negative side. In other words, the positive electrode and the negative electrode of the negative-side sampling capacitor 327 are exchanged with each other before the conversion. For this reason, the positive voltage $CM_{inp}$ and the negative voltage $CM_{inn}$ are differential signals as illustrated in Formulas 10 and 11.

In this manner, the analog-to-digital converter 200 executes single-ended-to-differential conversion by switching the connection of the capacitors inside the analog-to-digital converter 200 and then performs AD conversion. While switching the connection of the capacitors needs a plurality of MOS transistors, the power consumption of these MOS transistors is generally extremely smaller compared to the case of the operational amplifiers. For example, while the current consumption of the operational amplifier is in the unit of milliamperes (mA), the ON current (current consumption) of the MOS transistor is in the unit of nanoampere (nA). Moreover, while it is necessary for the operational amplifier to always operate during AD conversion in the use of the operational amplifier, it is not necessary in the use of a MOS transistor to always perform a switching operation, and switching operation is merely required at single-ended-to-differential conversion.

Therefore, it is possible to make the power consumption of the electronic device 100 extremely small as compared with a comparative example in which the single-ended-to-differential conversion circuit using an operational amplifier is provided in the preceding stage of the ADC. Furthermore, as compared with the comparative example, the circuit scale of the electronic device 100 can be reduced. In addition, the switching operation inside the electronic device 100 is symmetrical between the positive side and the negative side, making it possible to suppress the noise accompanying the switching operation. With this configuration, it is possible to reduce the influence of interference caused by the noise due to switching operation with the signal.

Figure 10:
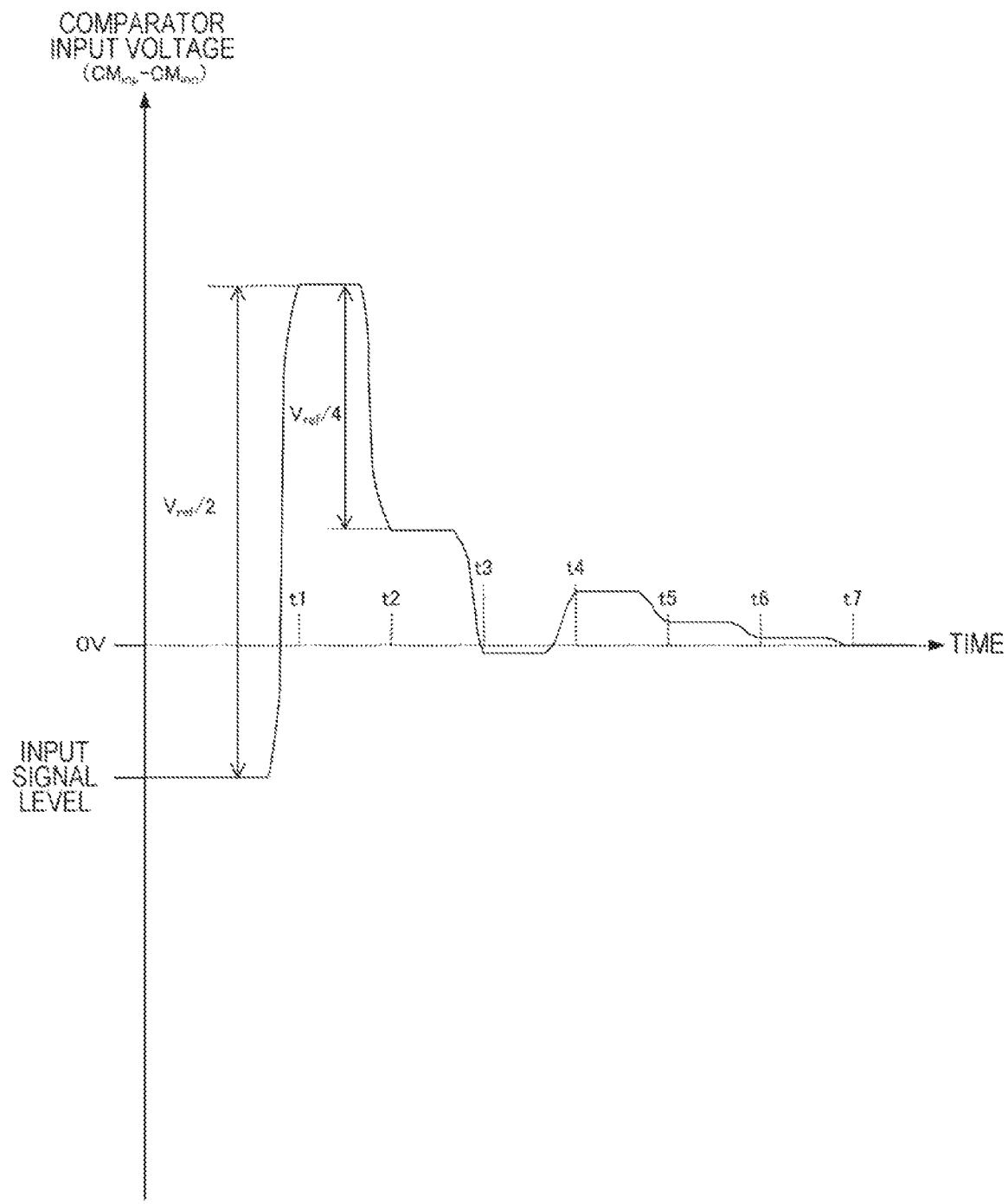
FIG. 10 is a graph illustrating an example of fluctuation in comparator input voltage in the first embodiment of the present technology.

FIG. 10 is a graph illustrating an example of fluctuation in comparator input voltage in the first embodiment of the present technology. The coaxial vertical axis represents $CM_{inp}$–$CM_{inn}$ being the voltage of the differential signal input to the comparator 230, and the horizontal axis represents the time.

In a case where the level of the input differential signal is higher than "0" (that is, the positive voltage $CM_{inp}$ is higher than the negative voltage $CM_{inn}$), the comparator 230 outputs a comparison result of the high level as the (N−1)th bit. In contrast, in a case where the level of the differential signal is "0" or less, the comparator 230 outputs the low level as the (N−1)th bit. In a case where the (N−1)th bit is at the high level, the DAC control unit 250 at the succeeding stage of the comparator 230 controls either the positive voltage or the negative voltage such that the positive voltage becomes relatively lower by either the control signals $DACP_{N-2}$ or $DACN_{N-2}$. In contrast, in a case where the (N−1)th bit is at the low level, the DAC control unit 250 controls either positive voltage or the negative voltage such that the positive voltage becomes relatively higher by either the control signal $DACP_{N-2}$ or $DACN_{N-2}$.

Next, the comparator 230 makes a comparison again after the control by the DAC control unit 250. When the last 0-th bit has not been output, the DAC control unit 250 controls the positive voltage $CM_{inp}$ or the negative voltage $CM_{inn}$ on the basis of the bit. The more the number of times of comparison, the less the increase/decrease level of these voltages.

For example, in a case where the first (N−1)th bit is at the low level at timing t1, the DAC control unit 250 controls to increase a difference between the positive voltage $CM_{inp}$ and the negative voltage $CM_{inn}$ by either the control signal $DACP_{N-2}$ or $DACN_{N-2}$ by $V_{refp}/2$. In a case where the next (N−2)th bit is at the high level at timing t2, the DAC control unit 250 controls to decrease the difference between the positive voltage $CM_{inp}$ and the negative voltage $CM_{inn}$ by either a control signal $DACP_{N-3}$ or $DACN_{N-3}$ by $V_{refp}/4$. Hereinafter, the similar successive approximation control is repeated until the last 0-th bit is output.

[Example of Operation of Analog-To-Digital Converter]

Figure 11:
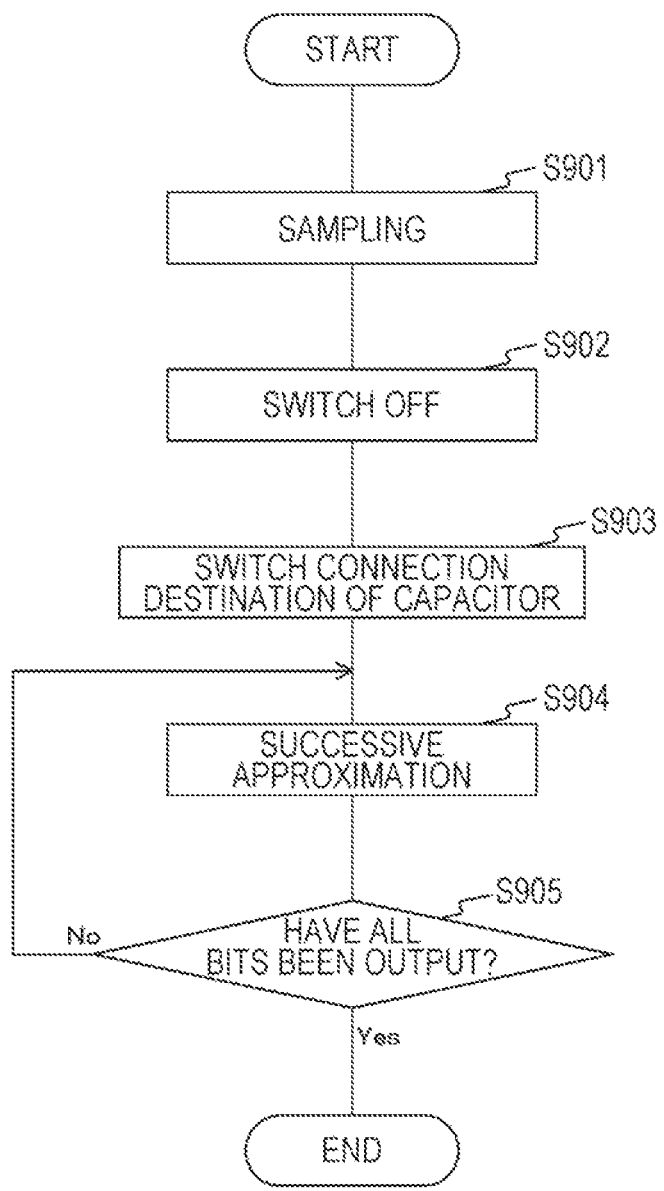
FIG. 11 is a flowchart illustrating an example of operation of the analog-to-digital converter according to the first embodiment of the present technology.

FIG. 11 is a flowchart illustrating an example of operation of the analog-to-digital converter 200 according to the first embodiment of the present technology. This operation is executed in synchronization with the sampling clock $CLK_0$.

The analog-to-digital converter 200 samples a single-ended signal (step S901) and sets all the switches such as the switch 313 to the open state (OFF) (step S902). Next, the analog-to-digital converter 200 switches the connection destination of the capacitor such as the sampling capacitor 317 (step S903). With this processing, the single-ended signal is converted into a differential signal. Next, the analog-to-digital converter 200 converts the differential signal into a digital signal by successive approximation and outputs the digital signal one bit at a time (step S904).

The analog-to-digital converter 200 determines whether or not all the N bits have been output (step S905). In a case where not all the bits have been output (step S905: No), the analog-to-digital converter 200 continues the successive approximation operation in step S904. In contrast, in a case where all bits have been output (step S905: Yes), the analog-to-digital converter 200 finishes the operation.

In this manner, according to the first embodiment of the present technology, the analog-to-digital converter 200 switches the connection destination of each of the sampling capacitors 317 and 327, making it possible to convert the single-ended signal to the differential signal. Since the power consumption of the MOS transistor necessary for switching this connection destination is much smaller than that of the operational amplifier, it is possible to reduce the power consumption as compared with the case where a single-ended-to-differential conversion circuit using an operational amplifier is provided.

[First Modification]

In the above-described first embodiment, the switches 316 and 326 are shifted to the open (OFF) state at the same time. However, turning these switches off simultaneously might cause a problem of an increase in the charge injection. Here, charge injection is a current flowing through the capacitance component in the switch during switching, which causes switching noise. The analog-to-digital converter 200 according to the first modification of the first embodiment is different from the first embodiment in that it suppresses switching noise due to charge injection.

Figure 12:
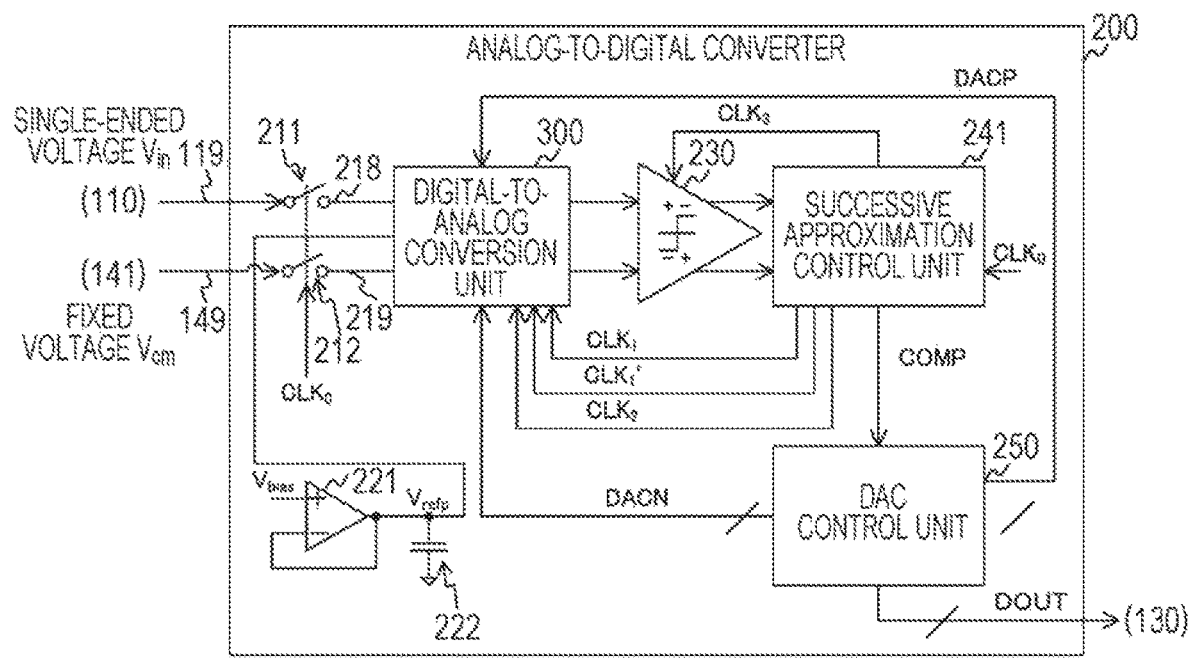
FIG. 12 is a block diagram illustrating a configuration example of an analog-to-digital converter according to a first modification of the first embodiment of the present technology.

FIG. 12 is a block diagram illustrating a configuration example of the analog-to-digital converter 200 according to the first modification of the first embodiment of the present technology. The analog-to-digital converter 200 according to the first modification of the first embodiment is different from the first embodiment in that a successive approximation control unit 241 is provided instead of the successive approximation control unit 240.

The successive approximation control unit 241 is different from the first embodiment in that it further generates a switching control clock CLK1'.

Figure 13:
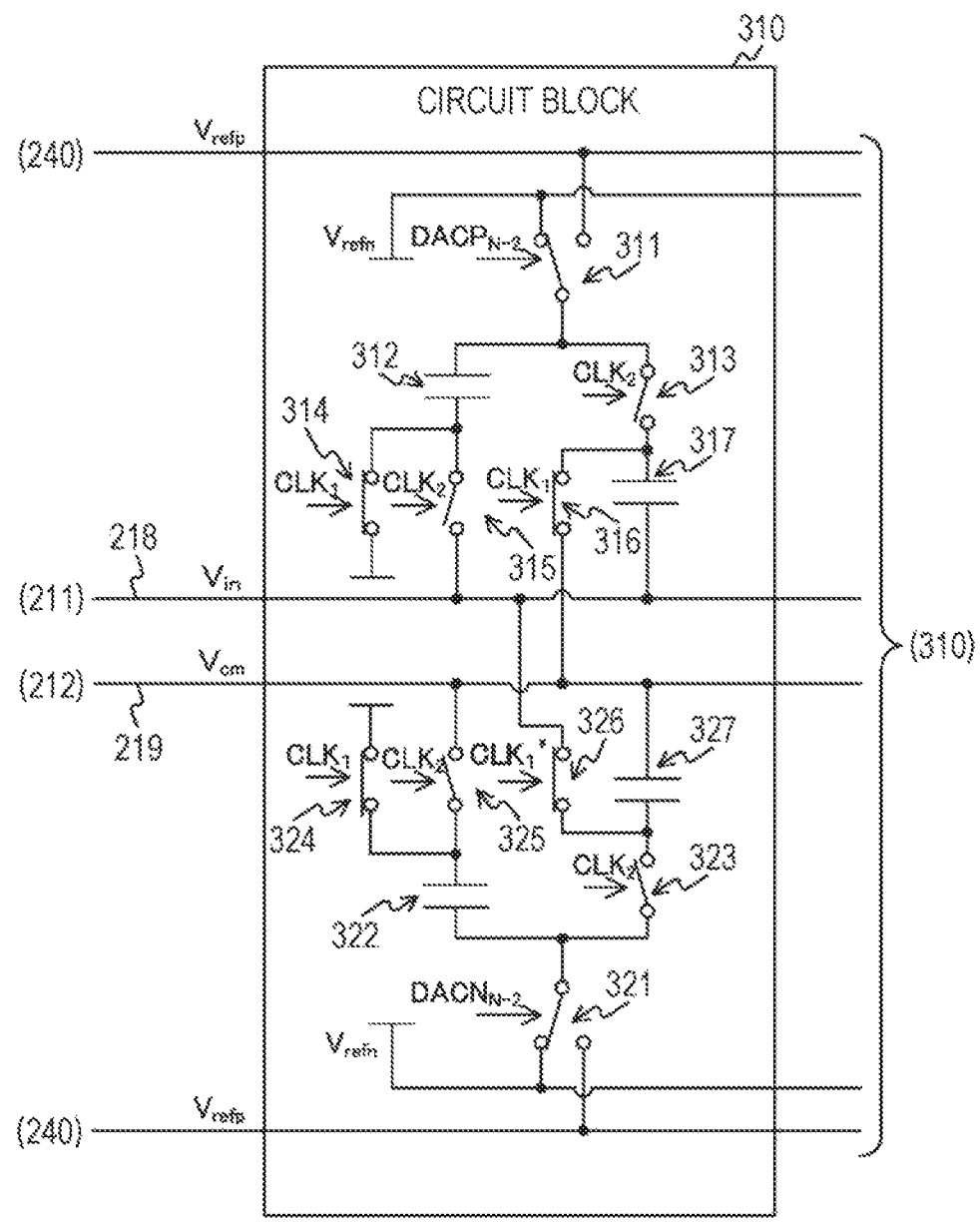
FIG. 13 is a circuit diagram illustrating a configuration example of a circuit block according to the first modification of the first embodiment of the present technology.

FIG. 13 is a circuit diagram illustrating a configuration example of the circuit block 310 in the first modification of the first embodiment of the present technology. The circuit block 310 according to the first modification of the first embodiment is different from the first embodiment in that the switch 326 opens and closes the path in accordance with the switching control clock $CLK_1'$.

Figure 14:
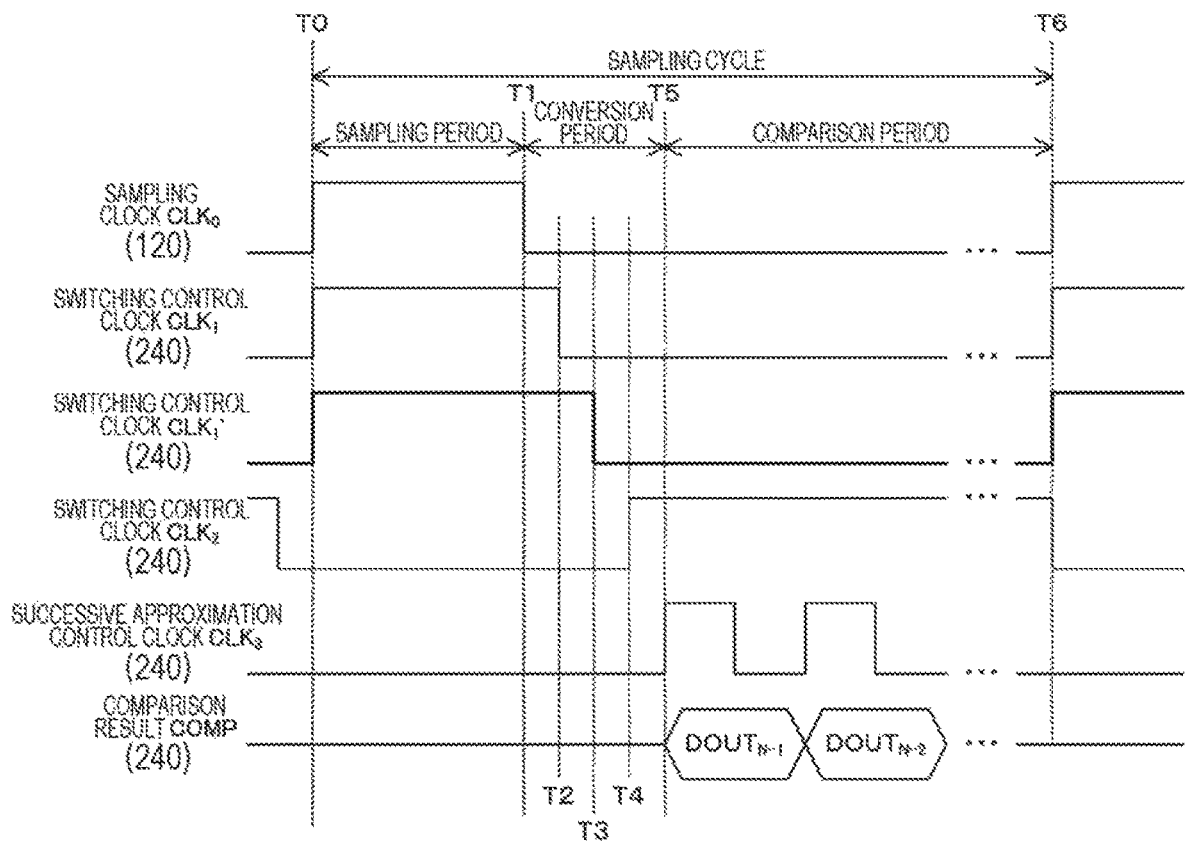
FIG. 14 is a timing chart illustrating an example of the operation of the analog-to-digital converter in the first modification of the first embodiment of the present technology.

FIG. 14 is a timing chart illustrating an example of the operation of the analog-to-digital converter 200 according to the first modification of the first embodiment of the present technology. In the sampling period, the successive approximation control unit 240 controls the switching control clock $CLK_1'$ to a high level. Next, at timing T2 within the conversion period, the successive approximation control unit 240 sets the switching control clock $CLK_1$ to the low level and sets the switching control clock $CLK_1'$ to the low level at the subsequent timing T3. Next, at timing T4, the successive approximation control unit 240 controls the switching control clock $CLK_2$ to the high level, and the DAC control unit 250 supplies the successive approximation control clock $CLK_3$ on timing T5 or later.

By controlling the switching control clock $CLK_1'$ to a low level at a timing different from that of the switching control clock $CLK_1$, the switch 326 can be turned off at a timing different from that of the switch 316. By avoiding simultaneous switching of the switches 316 and 326, it is possible to suppress switching noise caused by charge injection.

In this manner, according to the first modification of the first embodiment of the present technology, since the successive approximation control unit 240 turns off the switch 326 at a timing different from that of the switch 316, it is possible to suppress the switching noise due to charge injection.

[Second Modification]

In the above-described first embodiment, it is necessary to provide eight switches for each of the circuit blocks 310 in order to switch the connection destination of the capacitor, leading to necessity to provide 8×(N−1) switches for the entire analog-to-digital converter 200. Therefore, the more the bit length N of the digital signal DOUT, the more the number of switches, leading to enlargement of the circuit scale and power consumption. The analog-to-digital converter 200 of the second modification of the first embodiment is different from the first embodiment in that the number of switches for switching the connection destination of the capacitor is reduced.

Figure 15:
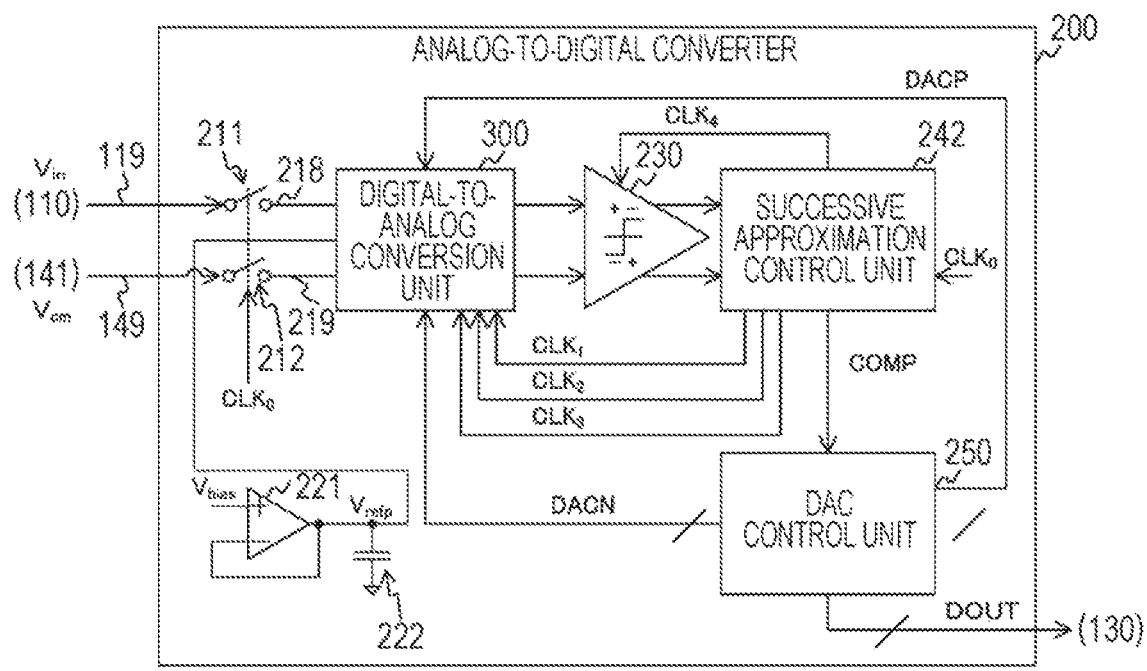
FIG. 15 is a block diagram illustrating a configuration example of an analog-to-digital converter according to a second modification of the first embodiment of the present technology.

FIG. 15 is a block diagram illustrating a configuration example of the analog-to-digital converter 200 according to the second modification of the first embodiment of the present technology. The analog-to-digital converter 200 according to the second modification of the first embodiment is different from the first embodiment in that a successive approximation control unit 242 is provided instead of the successive approximation control unit 240. Furthermore, the digital-to-analog conversion unit 300 according to the second modification of the first embodiment switches the connection destination of the capacitor by using a smaller number of switches than in the first embodiment.

In addition, the successive approximation control unit 242 is different from the first embodiment in that the successive approximation control unit 242 further generates the switching control clock $CLK_3$ and generates a successive approximation control clock $CLK_4$ instead of the successive approximation control clock $CLK_3$.

Figure 16:
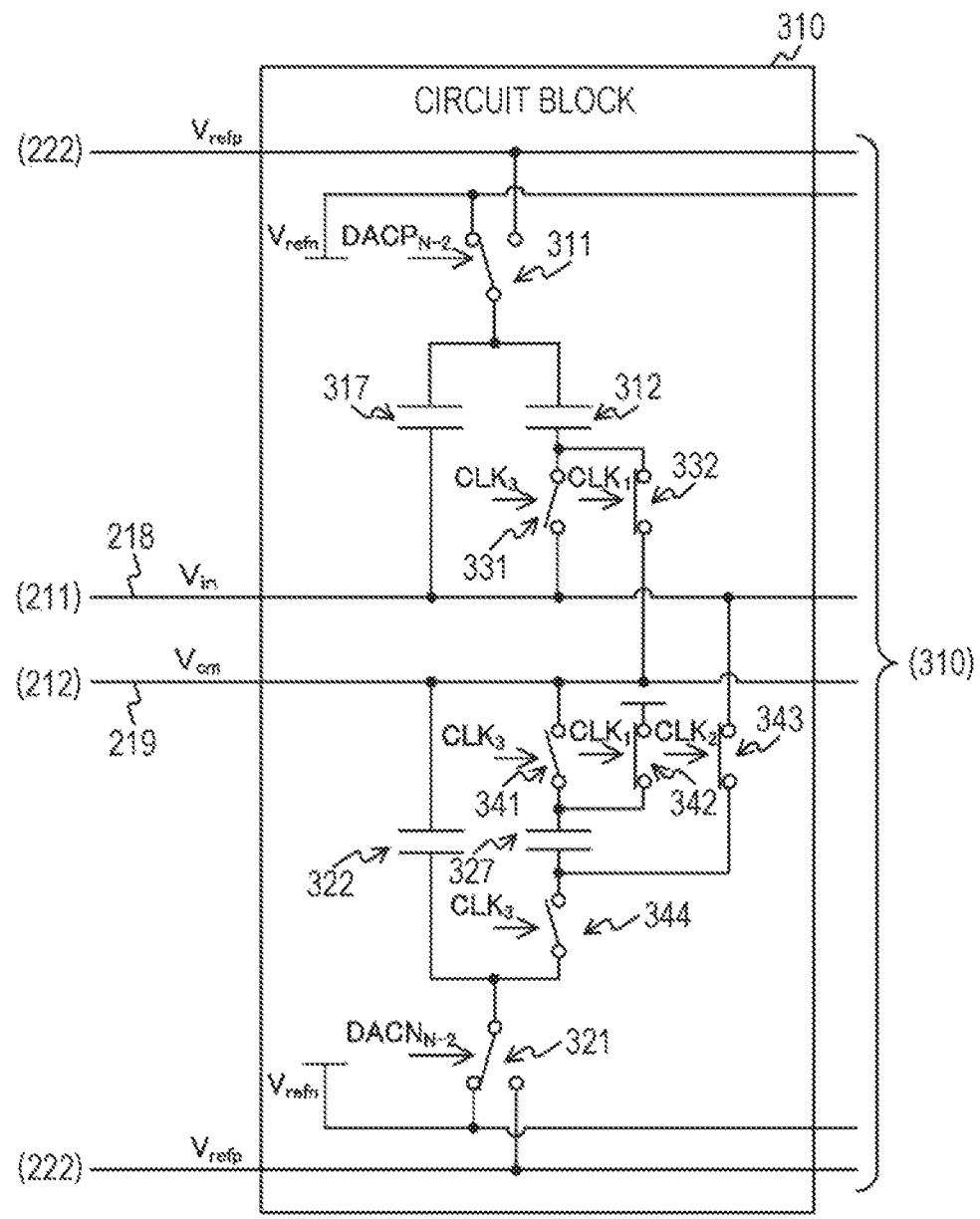
FIG. 16 is a circuit diagram illustrating a configuration example of a circuit block according to the second modification of the first embodiment of the present technology.

FIG. 16 is a circuit diagram illustrating a configuration example of the circuit block 310 according to the second modification of the first embodiment of the present technology. The circuit block 310 according to the second modification of the first embodiment is different from the first embodiment in that it includes the switches 331, 332, 341, 342, 343, and 344 in place of the switches 313 to 316 and 323 to 326.

One end of the sampling capacitor 317 is connected to the positive-side signal line 218, and the other end is connected to the switch 311 and the common voltage generating capacitor 312. One end of the common voltage generating capacitor 312 is connected to the switch 311 and the sampling capacitor 317, and the other end is connected to the switches 331 and 332.

Furthermore, the switch 331 opens and closes a path between the common voltage generating capacitor 312 and the positive-side signal line 218 in accordance with the switching control clock $CLK_3$. For example, the switch 331 shifts to the closed state in a case where the switching control clock $CLK_3$ is at the high level, and shifts to the open state in a case where the switching control clock $CLK_3$ is at the low level. Similarly, the other switches 332, 341, 342, 343 and 344 shift to the closed state in a case where the switching control clock is at a high level, and shift to the open state in a case where the switching control clock is at a low level.

Furthermore, the switch 332 opens and closes the path between the common voltage generating capacitor 312 and the negative-side signal line 219 in accordance with the switching control clock $CLK_1$.

One end of the common voltage generating capacitor 322 is connected to the negative-side signal line 219, and the other end is connected to the switches 344 and 321. One end of the sampling capacitor 327 is connected to the switches 341 and 342, and the other end is connected to the switches 343 and 344.

Furthermore, the switch 341 opens and closes a path between the sampling capacitor 327 and the negative-side signal line 219 in accordance with the switching control clock $CLK_3$. The switch 342 opens and closes a path between the sampling capacitor 327 and the power supply terminal in accordance with the switching control clock $CLK_1$.

Furthermore, the switch 343 opens and closes a path between the sampling capacitor 327 and the positive-side signal line 218 in accordance with the switching control clock $CLK_2$. The switch 344 opens and closes the path between the sampling capacitor 327 and the switch 321 in accordance with the switching control clock $CLK_3$.

As described above, in the second modification of the first embodiment, the number of switches necessary for switching can be set to five per the circuit block 310, making it possible to reduce the number of switches as compared with the first embodiment that needs eight switches per the circuit block 310.

Figure 17:
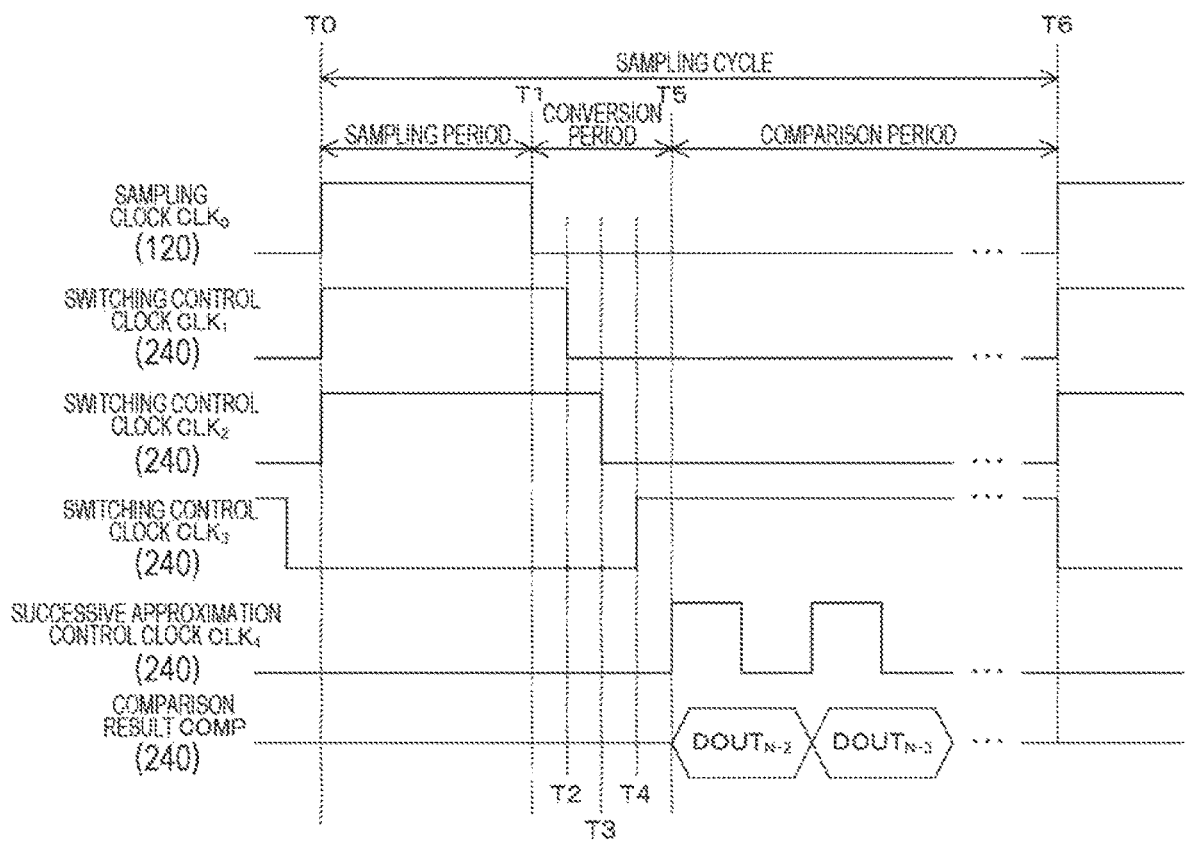
FIG. 17 is a timing chart illustrating an example of operation of the analog-to-digital converter in the second modification of the first embodiment of the present technology.

FIG. 17 is a timing chart illustrating an example of operation of the analog-to-digital converter 200 in the second modification of the first embodiment of the present technology. In the sampling period, the successive approximation control unit 240 sets the switching control clocks CLK$_1$ and CLK$_2$ to a high level and sets the switching control clock CLK$_3$ to a low level.

Furthermore, at timing T2 after the sampling clock CLK$_0$ becomes a low level, the successive approximation control unit 240 sets the switching control clock CLK$_1$ to a low level and sets the switching control clock CLK$_2$ to a low level at the subsequent timing T3. Next, at timing T4, the successive approximation control unit 240 controls the switching control clock CLK$_3$ to a high level, and the DAC control unit 250 supplies the successive approximation control clock CLK$_4$ on timing T5 or later.

Figure 18A:
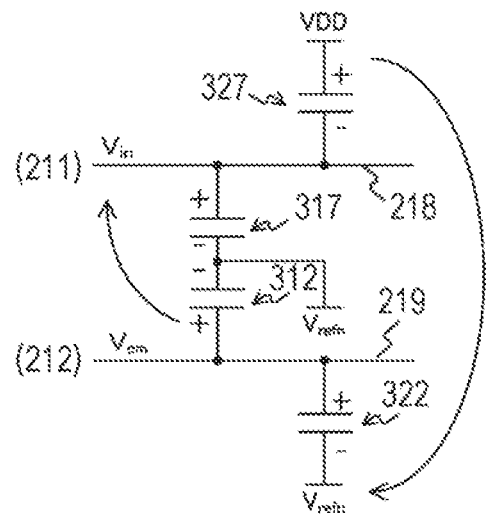
FIGS. 18A and 18B are diagrams illustrating an example of a connection configuration of a capacitor before and after single-ended-to-differential conversion according to the second modification of the first embodiment of the present technology.
Figure 18B:
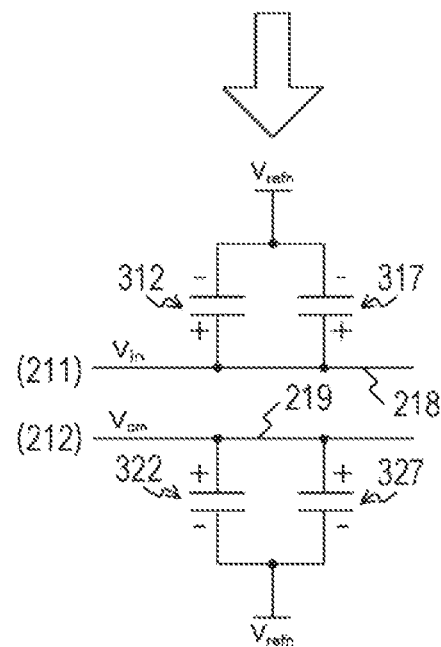

FIGS. 18A and 18B are diagrams illustrating an example of a connection configuration of a capacitor before and after single-ended-to-differential conversion according to the second modification of the first embodiment of the present technology. In the figure, various switches such as the switch 311 are omitted for convenience of description FIG. 18A is a diagram illustrating a connection configuration example of the capacitor at the start of the conversion period.

Both ends of the sampling capacitor 317 are connected to the positive-side signal line 218 and the negative-side reference signal line, and both ends of the sampling capacitor 327 are connected to the positive-side signal line 218 and the power supply terminal. Furthermore, the common voltage generating capacitors 312 and 322 are connected between the negative-side signal line 219 and the negative-side reference signal line. With this connection configuration, the single-ended signals are sampled onto the sampling capacitors 317 and 327, and the fixed voltage V$_{cm}$ is held in the common voltage generating capacitors 312 and 322.

FIG. 18B illustrates a connection configuration example of each of capacitors when the connection of each of the capacitors is switched during the conversion period.

The connection destination of one end of the positive-side common voltage generating capacitor 312 is switched from the negative-side signal line 219 to the positive-side signal line 218. Furthermore, the connection destination of both ends of the negative-side sampling capacitor 327 is switched from the power supply terminal and the positive-side signal line 218 to the negative-side signal line 219 and the negative-side reference signal line. Through these switching controls, a differential signal is generated.

In this manner, according to the second modification of the first embodiment of the present technology, since the circuit block 310 switches the connection destination of the capacitor with five switches, it is possible to reduce the number of switches as compared with the configuration that needs eight switches.

2. Second Embodiment

In the above-described first embodiment, the analog-to-digital converter 200 performs the successive approximation control using the reference voltage V$_{refp}$ held in the decoupling capacitor 222. However, the reference voltage V$_{refp}$ might fluctuate during the successive approximation control. This is because at least one of the decoupling capacitor 222 or a parasitic capacitance of the positive-side reference signal line is charged and discharged at the time of switching of the connection destination of one end of the capacitor by the switch 311 or the switch 321 from one of the negative-side and positive-side reference signal lines to the other. This fluctuation of the reference voltage V$_{refp}$ might deteriorate the accuracy of AD conversion. The analog-to-digital converter 200 according to a second embodiment is different from the first embodiment in that it suppresses fluctuation of the reference voltage V$_{refp}$.

Figure 19:
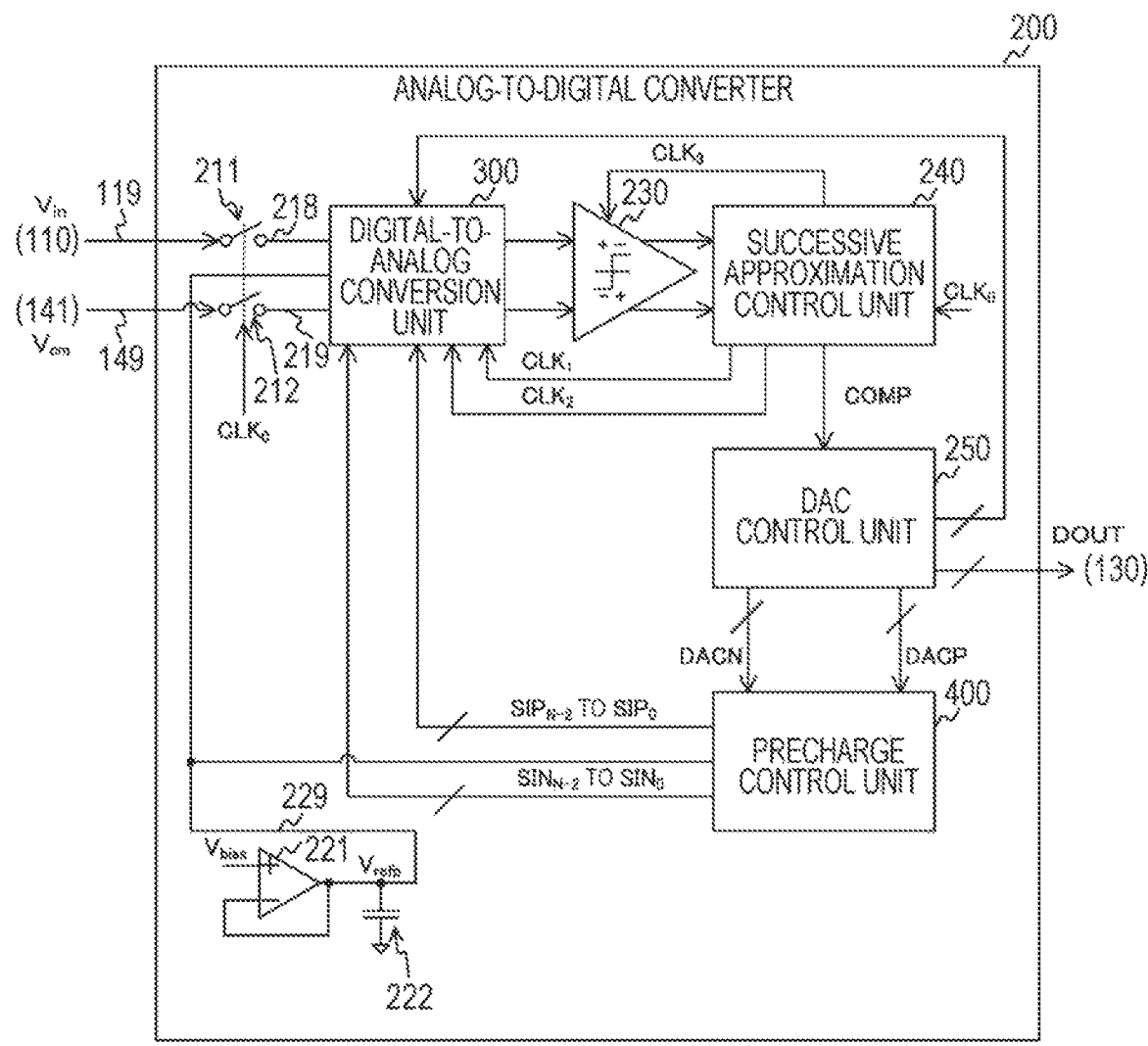
FIG. 19 is a block diagram illustrating a configuration example of an analog-to-digital converter according to a second embodiment of the present technology.

FIG. 19 is a block diagram illustrating a configuration example of the analog-to-digital converter 200 according to the second embodiment of the present technology. The analog-to-digital converter 200 according to the second embodiment is different from the first embodiment in that it further includes a precharge control unit 400.

When one of the control signals DACP$_n$ or DACN$_n$ is generated, the precharge control unit 400 charges the decoupling capacitor 222 and the reference signal line 229, and thereafter outputs the control signal. In this manner, by charging (in other words, precharging) the decoupling capacitor 222 or the like immediately before the output of the control signal, it is possible to suppress the fluctuation of the reference voltage V$_{refp}$.

Figure 20:
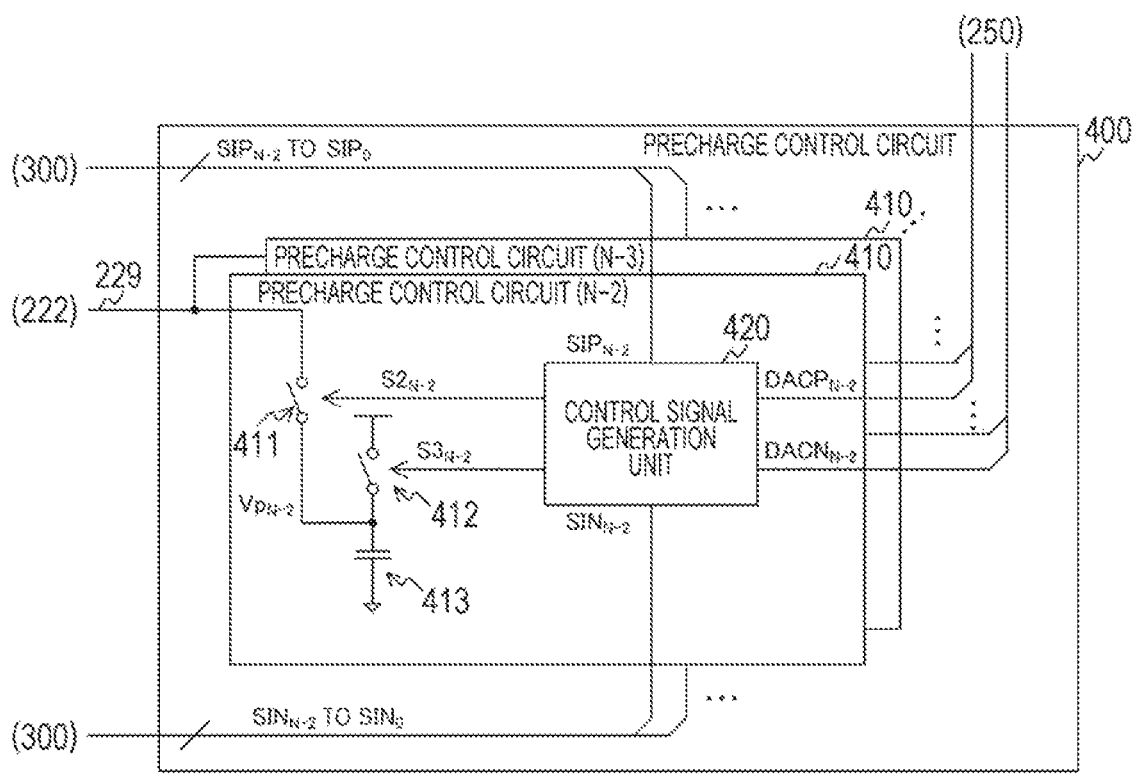
FIG. 20 is a block diagram illustrating a configuration example of a precharge control unit according to the second embodiment of the present technology.

FIG. 20 is a block diagram illustrating a configuration example of the precharge control unit 400 according to the second embodiment of the present technology. The precharge control unit 400 includes N−1 precharge control circuits 410. Each of the precharge control circuit 410 includes switches 411 and 412, a precharge capacitor 413, and a control signal generation unit 420.

One end of the precharge capacitor 413 is connected to a ground terminal, and the other end is connected to the switches 411 and 412. The capacitance of each of the precharge capacitors 413 of the N−1 precharge control circuits 410 is set to an appropriate value in accordance with the charging amount needed for precharging. For example, the capacitances of all the N−1 precharge capacitors 413 are set to substantially the same value. Note that since the necessary charging amount might differ for each of bits, there is no need to set all the capacitances of the N−1 precharge capacitors 413 to the same value.

The switch 411 opens and closes the path between the precharge capacitor 413 and the reference signal line 229 in accordance with a switching control signal S2$_n$ (n is an integer from 0 to N−2). For example, the switch 411 shifts to the closed state in a case where the switching control signal S2$_n$ is at a high level, and shifts to the open state in a case where the switching control signal S2$_n$ is at a low level.

The switch 412 opens and closes a path between the precharge capacitor 413 and the power supply terminal in accordance with a switching control signal S3$_n$. The switch 412, for example, shifts to the closed state in a case where the switching control signal S3$_n$ is at a high level, and shifts to the open state in a case where the switching control signal S3$_n$ is at a low level.

When the control signal DACP$_n$ or DACN$_n$ is generated, the control signal generation unit 420 first performs precharging by the switching control signals S2$_n$ and S3$_n$ and then outputs the control signal as SIP$_n$ or SIN$_n$ to the digital-to-analog conversion unit 300.

Figure 21:
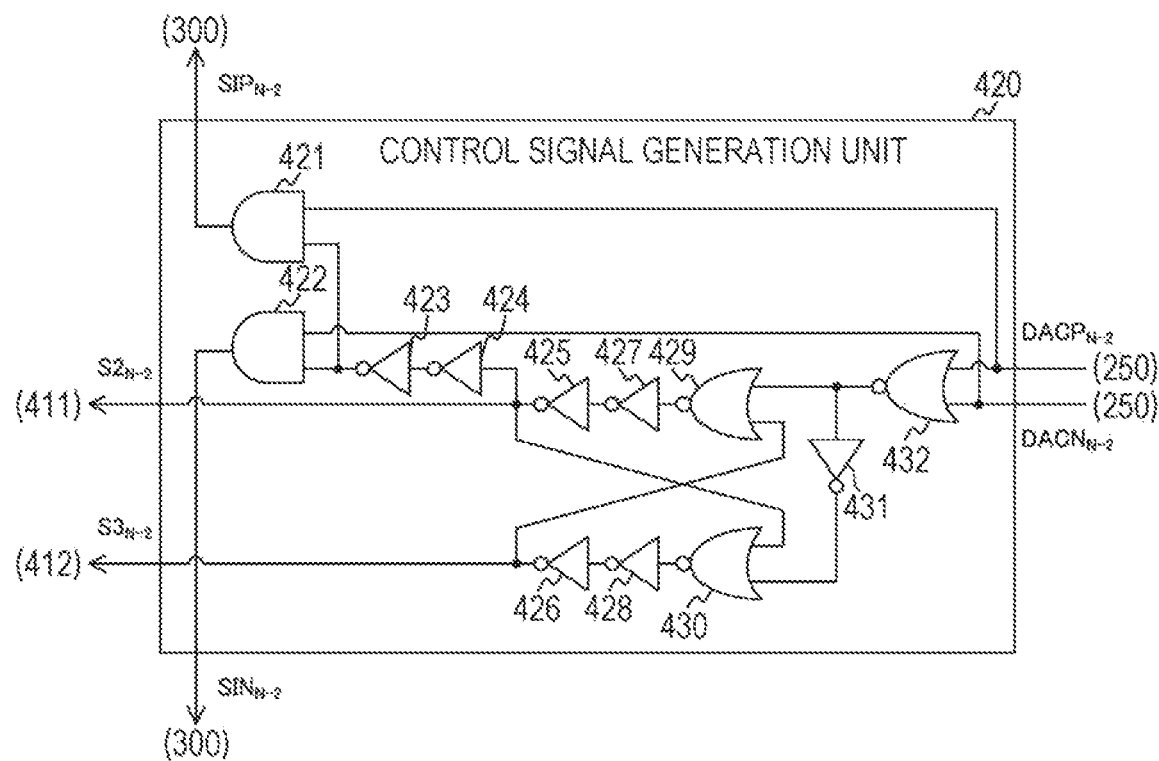
FIG. 21 is a circuit diagram illustrating a configuration example of a control signal generation unit according to the second embodiment of the present technology.

FIG. 21 is a circuit diagram illustrating a configuration example of the control signal generation unit 420 according to the second embodiment of the present technology. The control signal generation unit 420 includes AND (logical product) gates 421 and 422, NOT gates 423 to 428, NOR (logical NOR) gates 429, 430 and 432, and a NOT gate 431.

The NOR gate 432 outputs logical NOR of the control signal DACP$_n$ and the control signal DACN$_n$ to the NOR gate 429 and the NOT gate 431. The NOT gate 431 inverts an output signal of the NOR gate 432 and outputs the inverted signal to the NOR gate 430.

The NOR gate 429 outputs logical NOR of the output signal of the NOR gate 432 and the switching control signal S3$_n$ to the NOT gate 427. The NOT gates 425 and 427 delay the output signal of the NOR gate 429. The NOT gate 425 outputs the delayed signal as the switching control signal $S2_n$ to the NOT gate 424, the NOR gate 430, and the switch 411.

The NOR gate 430 outputs the logical NOR of the output signal of the NOT gate 431 and the switching control signal $S2_n$ to the NOT gate 428. The NOT gates 426 and 428 delay the output signal of NOR gate 430. The NOT gate 426 outputs the delayed signal as the switching control signal $S3_n$ to the NOR gate 429 and the switch 412.

The NOT gates 423 and 424 delay the switching control signal $S2_n$. The NOT gate 423 outputs the delayed signal to the AND gates 421 and 422.

The AND gate 421 outputs the logical product of the output signal of the NOT gate 423 and the control signal $DACP_n$ to the digital-to-analog conversion unit 300 as a control signal $SIP_n$. The AND gate 422 outputs the logical product of the output signal of the NOT gate 423 and the control signal $DACN_n$ to the digital-to-analog conversion unit 300 as a control signal $SIN_n$.

FIG. 22 is a diagram illustrating an example of operation of the control signal generation unit 420 according to the second embodiment of the present technology. In a case where both of the control signals $DACP_n$ and $DACN_n$ are the initial value "0", the control signal generation unit 420 sets the control signals $SIP_n$ and $SIN_n$ and the switching control signal $S2_n$ to the initial value "0" and sets the switching control signal $S3_n$ to the initial value "1". The precharge capacitor 413 is charged in accordance with these set initial values.

In a case where the control signal $DACP_n$ is "0" and the control signal $DACN_n$ is "1", the control signal generation unit 420 sets the switching control signal $S3_n$ to "0", and then the switching control signal $S2_n$ to "1". Through these controls, the precharge capacitor 413 is discharged and the decoupling capacitor 222 or the like are precharged. Next, after the precharge, the control signal generation unit 420 sets the control signal $SIN_n$ to "1" and outputs it. The control signal $SIN_n$ switches the connection destination of the negative-side capacitor to the ground terminal or the reference signal line 229.

In a case where the control signal $DACP_n$ is "1" and the control signal $DACN_n$ is "0", the control signal generation unit 420 sets the switching control signal $S3_n$ to "0", and then sets the switching control signal $S2_n$ to "1". By these controls, the decoupling capacitor 222 or the like are precharged. Next, after the precharge, the control signal generation unit 420 sets the control signal $SIP_n$ to "1" and outputs it. This control signal $SIP_n$ switches the connection destination of the positive-side capacitor to the ground terminal or the reference signal line 229.

Note that one of the control signals $DACP_n$ or $DACN_n$ is exclusively controlled to "1", and there would be no case where both are controlled to "1" at the same time.

Figure 23:
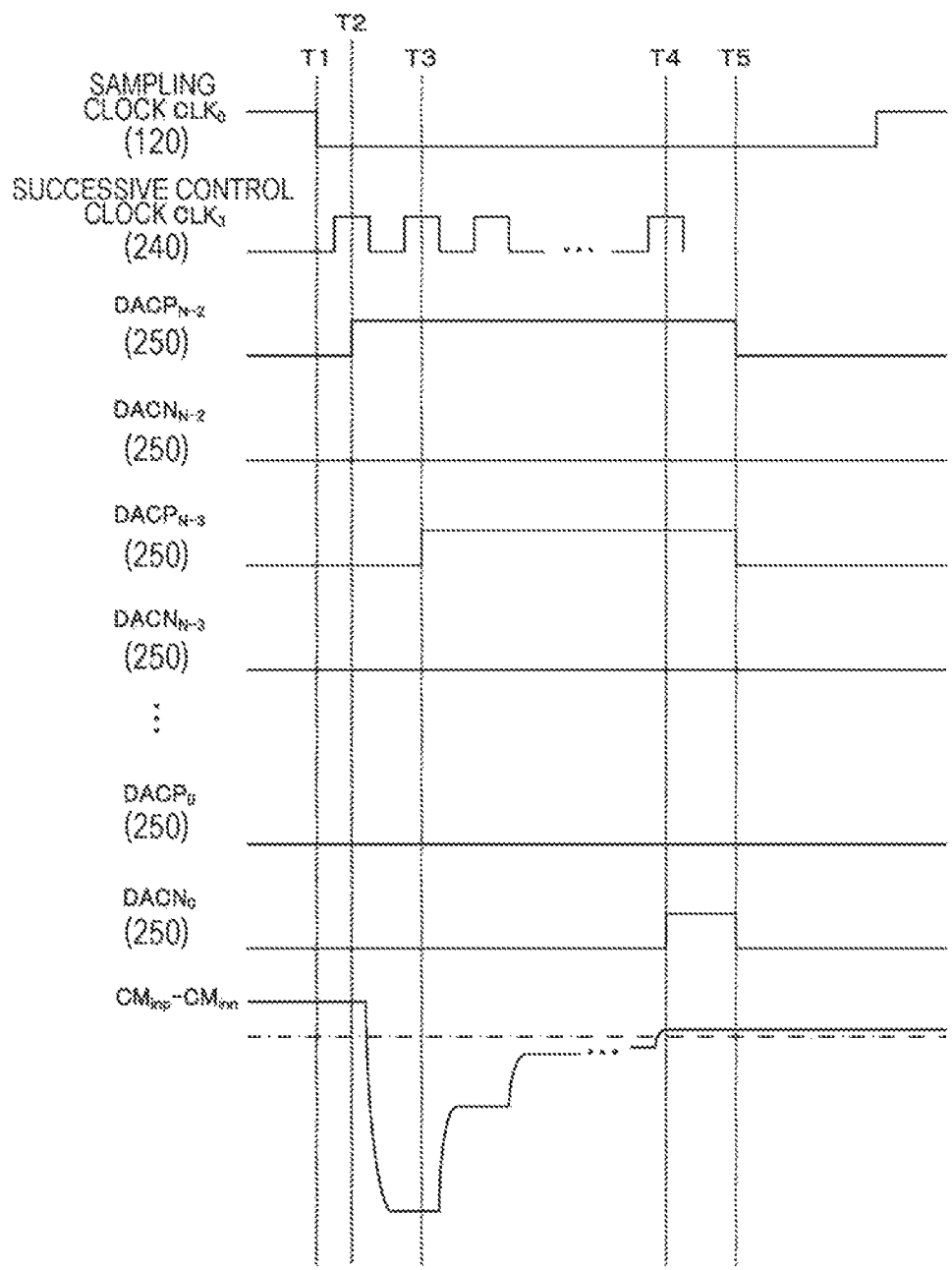
FIG. 23 is a timing chart illustrating an example of operation of a successive approximation control unit and a DAC control unit according to the second embodiment of the present technology.

FIG. 23 is a timing chart illustrating an example of operation of the successive approximation control unit 240 and a DAC control unit 250 according to the second embodiment of the present technology. It is assumed that the sampling period has finished at timing T1. Next, at timing T2 after the single-ended-to-differential conversion is performed, the DAC control unit 250 generates the control signal $DACP_{N-2}$ or $DACN_{N-2}$ in synchronization with the first successive approximation control clock $CLK_3$ on the basis of a first comparison result. For example, the control signal $DACP_{N-2}$ alone is controlled to "1".

Next, the DAC control unit 250 generates at timing T3 the control signal $DACP_{N-3}$ or $DACN_{N-3}$ in synchronization with the second successive approximation control clock $CLK_3$ on the basis of a second comparison result. For example, the control signal $DACP_{N-3}$ alone is controlled to "1".

Thereafter, similar successive approximation control is repeatedly performed, and the DAC control unit 250 generates the last control signal $DACP_0$ or $DACN_0$ at timing T4. For example, the control signal $DACN_0$ alone is controlled to "1".

When all the bits have been output, the DAC control unit 250 initializes the control signals $DACP_{N-2}$ to $DACP_0$ and the control signals $DACN_{N-2}$ to $DACN_0$ to "0" at timing T5.

Furthermore, $CM_{inp}-CM_{inn}$ being an input voltage of the comparator fluctuates with the value of the control signal $DACP_n$ or $DACN_n$.

Figure 24:
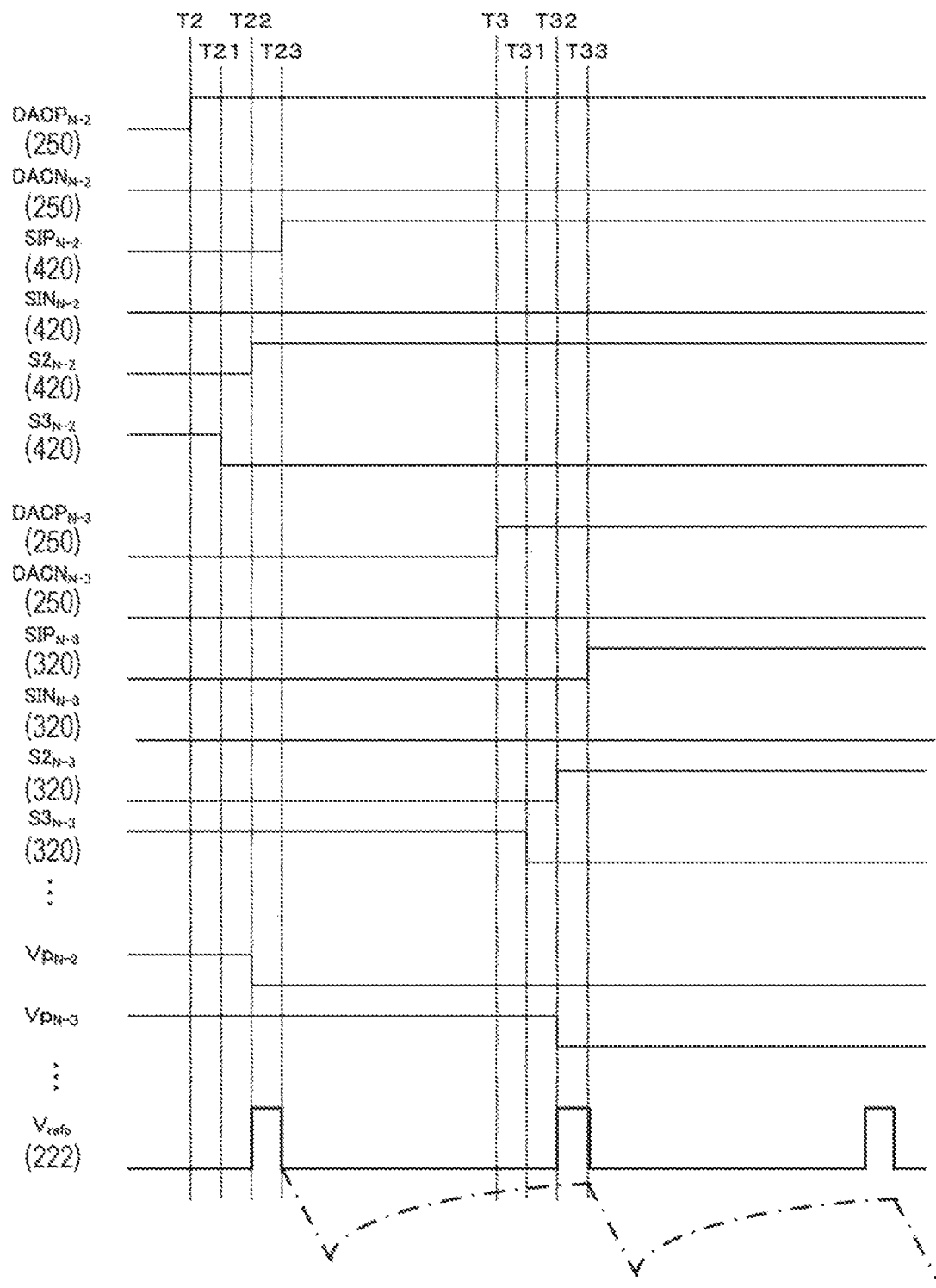
FIG. 24 is a timing chart illustrating an example of operation of the precharge control unit according to the second embodiment of the present technology.

FIG. 24 is a timing chart illustrating an example of operation of the precharge control unit 400 according to the second embodiment of the present technology. At timing T2, it is assumed that the control signal $DACP_{N-2}$ is controlled to "1".

The (N−2)th control signal generation unit 420 in the precharge control unit 400 sets the switching control signal $S3_{N-2}$ to "0" at timing T21 and then controls the switching control signal $S2_{N-2}$ to "1" at timing T22. Through these controls, the decoupling capacitor 222 or the like are precharged, leading to an increase in the reference voltage $V_{refp}$. In contrast, in the precharge, the (N−2)th precharge capacitor 413 discharges, leading to a decrease in the voltage $Vp_{N-2}$ of the precharge capacitor 413.

Next, at timing T23 after the precharge, the control signal generation unit 420 sets the control signal $SIP_{N-2}$ to "1" and outputs it.

At timing T3 following timing T23, the control signal $DACPN_{N-3}$ is controlled to "1" on the basis of the second comparison result.

The (N−3)th control signal generation unit 420 sets the switching control signal $S3_{N-3}$ to "0" at timing T31 and then controls a switching control signal $S2_{N-3}$ to "1" at timing T32. Through these controls, the decoupling capacitor 222 or the like are precharged, leading to an increase in the reference voltage $V_{refp}$. In contrast, in the precharge, the (N−3)th precharge capacitor 413 discharges, leading to a decrease in the voltage $Vp_{N-3}$ of the precharge capacitor 413.

Next, at timing T33 after the precharge, the control signal generation unit 420 sets the control signal $SIP_{N-3}$ to "1" and outputs it. Hereinafter, the similar control is repeatedly performed until the last bit.

When the value of the control signal $DACP_n$ or $DACN_n$ has transitioned, the connection destination of one end of the n-th bit sampling capacitor 317 or 327 is switched from one of the reference signal line 229 and the ground terminal to the other. Since the control signals $DACP_n$ and $DACN_n$ are exclusively controlled as described above, the connection destination of one of the positive-side and negative-side sampling capacitors alone is switched. During this switching, the sampling capacitor and the parasitic capacitance in the digital-to-analog conversion unit 300 are charged and discharged. For this charge and discharge, charges must move from the reference buffer 221 at a high speed and a response for this might not be performed in time on the reference buffer 221 with ordinary performance.

In the first embodiment, since the control signals $DACP_n$ and $DACN_n$ are directly input to the digital-to-analog conversion unit 300, the reference buffer 221 cannot respond in time, causing fluctuation in the reference voltage $V_{refp}$. This fluctuation might deteriorate the accuracy of AD conversion. The one-dot chain line in FIG. 24 illustrates the fluctuation of the reference voltage $V_{refp}$ in the first embodiment.

In contrast, in the second embodiment, the precharge control unit 400 supplies the delayed control signal $SIP_n$ or $SIN_n$ after precharging the decoupling capacitors 222 or the like, making it possible to suppress the fluctuation of the reference voltage $V_{refp}$. With this configuration, the accuracy of AD conversion can be improved.

In this manner, according to the second embodiment of the present technology, the precharge control unit 400 outputs the control signal after precharging the decoupling capacitor 222 or the like, making it possible suppress the fluctuation of the reference voltage $V_{refp}$.

[Modification]

In the second embodiment described above, the sampling switches 211 and 212 input a single-ended signal to the top plate being the electrode on the comparator 230 side out of both the poles of the sampling capacitors 317 and 327. Such sampling is referred to as top plate sampling. Alternatively, however, the analog-to-digital converter 200 can also perform bottom plate sampling of inputting the single-ended signal to the bottom plate on the opposite side of the top plate. The analog-to-digital converter 200 according to a modification of the second embodiment is different from the second embodiment in that bottom plate sampling is performed.

Figure 25:
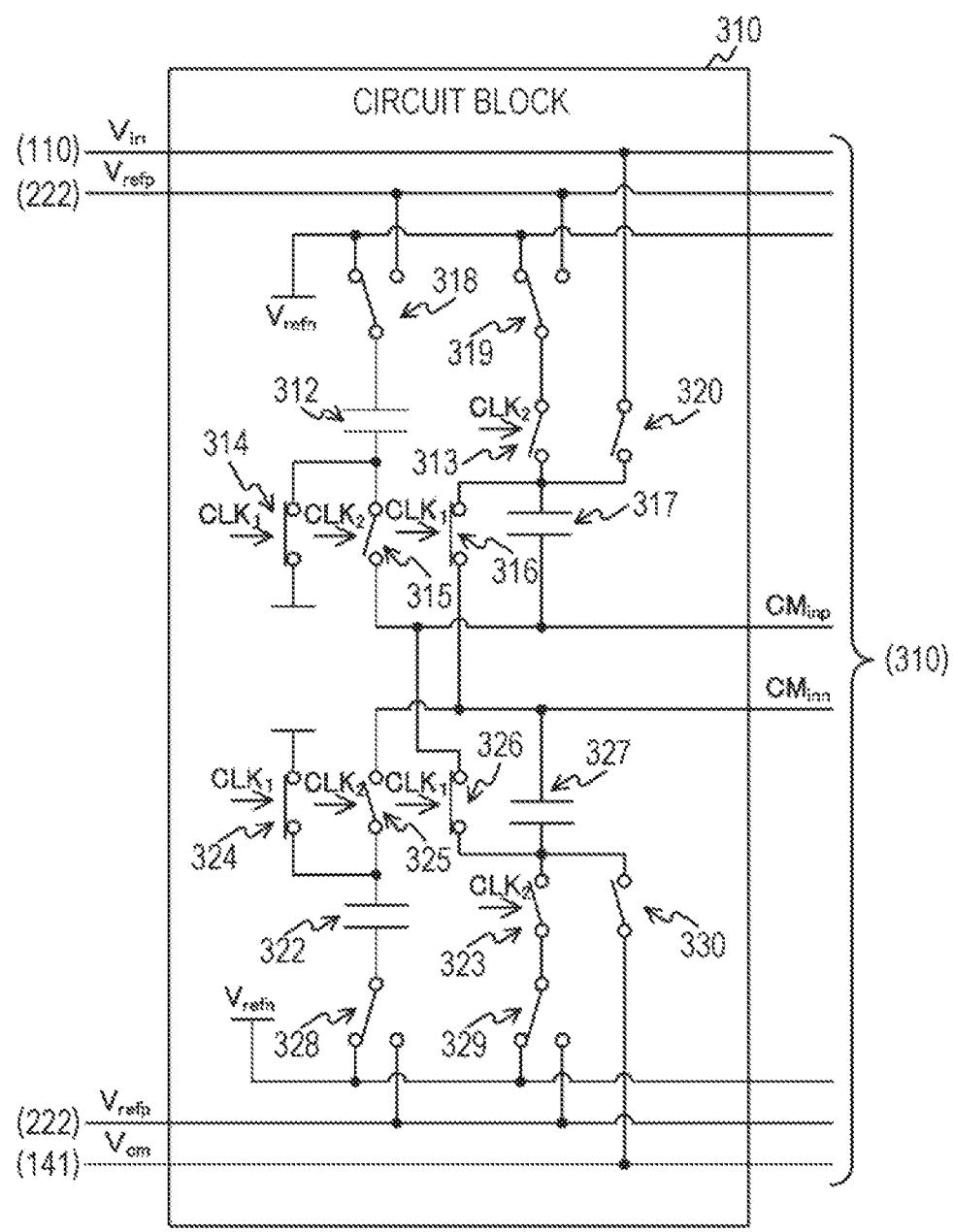
FIG. 25 is a diagram illustrating an example of states of a switch and a circuit block according to a modification of the second embodiment of the present technology.

FIG. 25 is a diagram illustrating an example of states of a switch and the circuit block 310 according to a modification of the second embodiment of the present technology. The analog-to-digital converter 200 according to the modification of the second embodiment does not include the sampling switches 211 or 212. In addition, instead of the switches 311 and 321, switches 318, 319, 320, 328, 329 and 330 are provided.

The switch 318 connects the common voltage generating capacitor 312 to one of the positive-side reference signal line of the reference voltage $V_{refp}$ or the negative-side reference signal line of the reference voltage $V_{refn}$ under the control of the DAC control unit 250. Furthermore, the switch 328 connects the common voltage generating capacitor 322 to one of the positive-side reference signal line of the reference voltage $V_{refp}$ or the negative-side reference signal line of the reference voltage $V_{refn}$ under the control of the DAC control unit 250. For example, during the sampling period and the conversion period, the switches 318 and 328 connect common voltage generating capacitors 312 and 322 to the negative-side reference signal line. Next, in the comparison period in which successive approximation control is performed, the switch 318 or 328 connects the common voltage generating capacitor 312 or 322 to the positive-side reference signal line on the basis of a comparison result.

The switch 319 connects the switch 313 to one of the positive-side reference signal line of the reference voltage $V_{refp}$ or the negative-side reference signal line of the reference voltage $V_{refn}$ under the control of the DAC control unit 250. Furthermore, the switch 329 connects the switch 323 to one of the positive-side reference signal line of the reference voltage $V_{refp}$ or the negative-side reference signal line of the reference voltage $V_{refn}$ under the control of the DAC control unit 250. For example, during the sampling period and the conversion period, the switches 319 and 329 connect the switch 313 or 323 to the negative-side reference signal line. Next, in the comparison period in which the successive approximation control is performed, the switch 319 or 329 connects the sampling capacitor 317 or 327 to the positive-side reference signal line via the switch 313 or 323 on the basis of a comparison result.

The switch 320 opens and closes a path between the sampling capacitor 317 and the positive-side signal line of the single-ended voltage $V_{in}$ in accordance with the sampling clock $CLK_0$. The switch 330 opens and closes a path between the sampling capacitor 327 and the negative-side signal line of the fixed voltage $V_{cm}$ in accordance with the sampling clock $CLK_0$. For example, the switches 320 and 330 change to the closed state during the sampling period, and the switches 320 and 330 shift to the open state during the other periods. With these switches 320 and 330, a single-ended signal is input to the bottom plate which is not connected to the comparator 230 out of both the poles of the sampling capacitors 317 and 327.

In this manner, according to the modification of the second embodiment of the present technology, the analog-to-digital converter 200 inputs the single-ended signal to the bottom plate, making it possible to reduce power consumption in execution of bottom plate sampling.

3. Third Embodiment

In the second embodiment described above, each of the N−1 precharge control circuits 410 has been precharged by a fixed charging amount. However, when setting the charging amount to a fixed value, fluctuation of the reference voltage $V_{refp}$ cannot be sufficiently suppressed in some cases. This is because the charge amount to be compensated by the precharge control circuit 410 varies in accordance with the value of the digital signal DOUT. Therefore, it is preferable that the precharge control circuit 410 controls the charging amount when precharging, on the basis of the digital signal DOUT. The precharge control circuit 410 according to a third embodiment is different from the second embodiment in that the charging amount is controlled on the basis of the digital signal DOUT.

Figure 26:
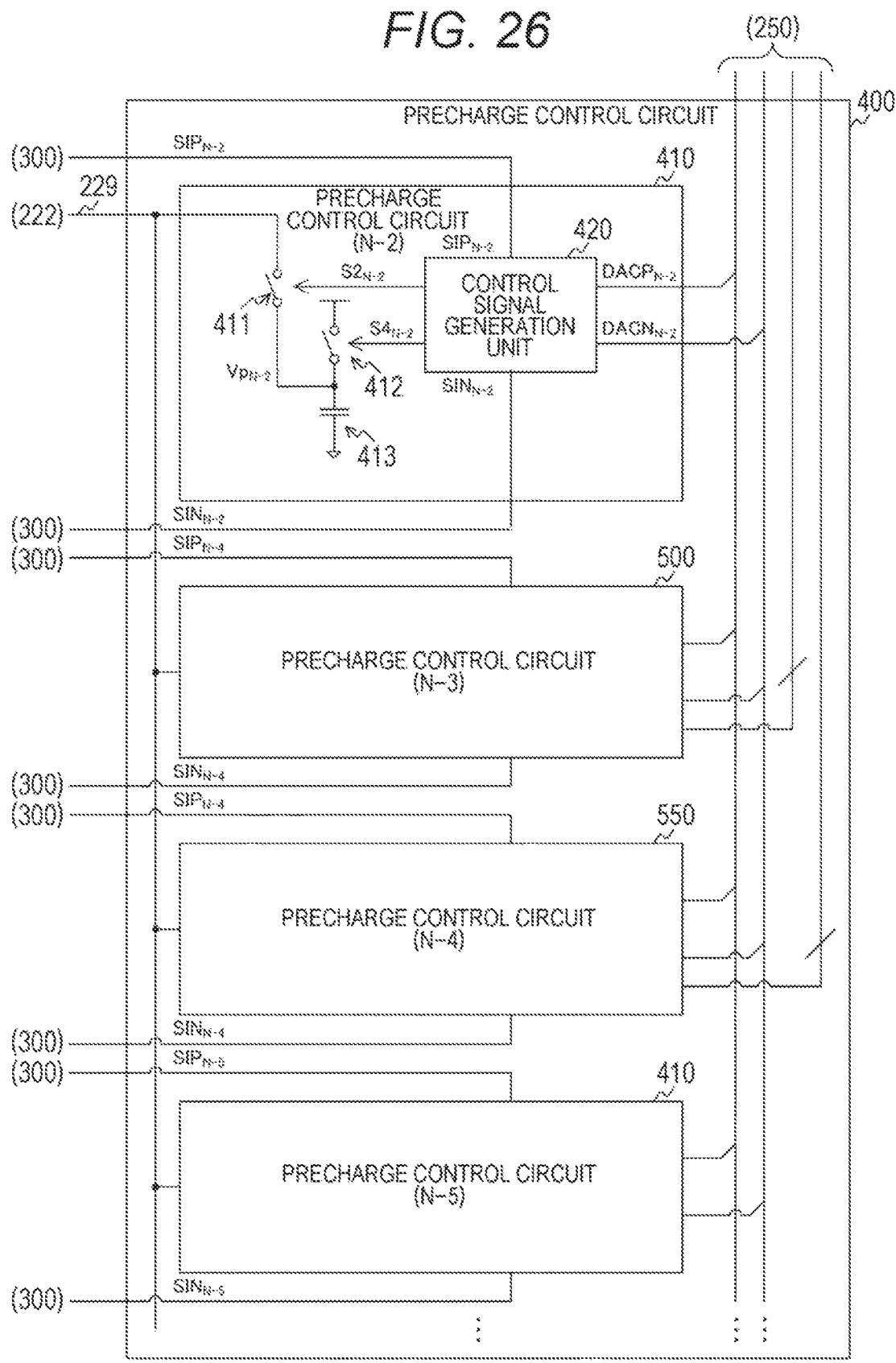
FIG. 26 is a block diagram illustrating a configuration example of a precharge control unit according to a third embodiment of the present technology.

FIG. 26 is a block diagram illustrating a configuration example of the precharge control unit 400 according to the third embodiment of the present technology. The precharge control unit 400 according to the third embodiment includes N−3 precharge control circuits 410 and precharge control circuits 500 and 550.

The precharge control circuit 500 is a circuit corresponding to the (N−3)th bit. The precharge control circuit 500 controls the charging amount on the basis of $DOUT_{N-1}$ and $DOUT_{N-2}$.

The precharge control circuit 550 is a circuit corresponding to the (N−4)th bit. The precharge control circuit 550 controls the charging amount on the basis of $DOUT_{N-1}$, $DOUT_{N-2}$, and $DOUT_{N-3}$.

The configuration of the precharge control circuit 410 corresponding to the remaining (N−2)th bit and the (N−5)th bit onward is similar to the configuration of the second embodiment.

Figure 27:
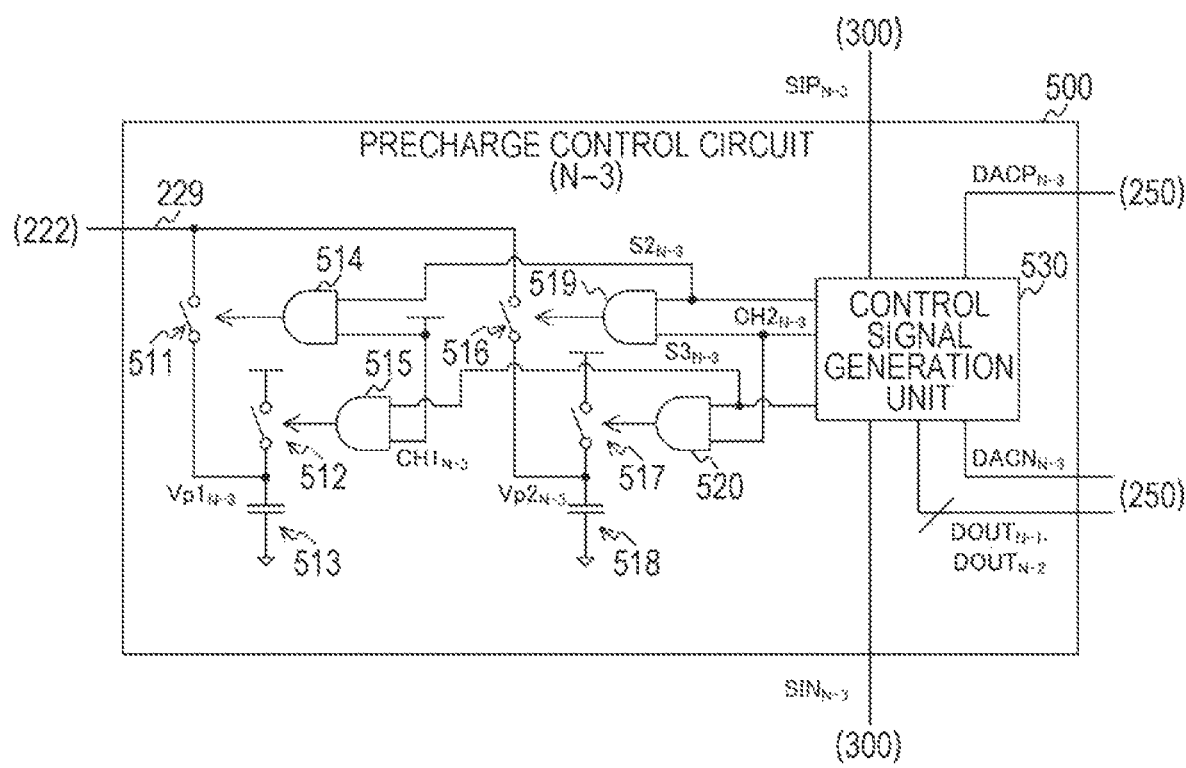
FIG. 27 is a circuit diagram illustrating a configuration example of a precharge control circuit corresponding to a (N−3)th bit according to the third embodiment of the present technology.

FIG. 27 is a circuit diagram illustrating a configuration example of the precharge control circuit 500 corresponding to the (N−3)th bit according to the third embodiment of the present technology. The precharge control circuit 500 includes switches 511, 512, 516 and 517, precharge capacitors 513 and 518, AND gates 514, 515, 519, and 520, and a control signal generation unit 530.

The switch 511 opens and closes the path between the decoupling capacitor 222 and the precharge capacitor 513 in accordance with the output signal from the AND gate 514. For example, the switch 511 shifts to the closed state in a case where the output signal from the AND gate 514 is at a high level, and shifts to the open state in a case where the output signal from the AND gate 514 is at a low level. Similarly, the other switches 512, 516 and 517 shift to the closed state in a case where the output signal of the corresponding logic gate is at a high level and shift to the open state in a case where the output signal of the corresponding logic gate is at a low level.

The switch 512 opens and closes the path between the power supply terminal and the precharge capacitor 513 in accordance with the output signal from the AND gate 515. One end of the precharge capacitor 513 is grounded, and the other end is connected to the switches 511 and 512.

The AND gate 514 outputs the logical product of the switching control signal $S2_{N-3}$ and the high level charge control signal $CH1_{N-3}$ to the switch 511. The AND gate 515 outputs the logical product of the switching control signal $S3_{N-3}$ and the charge control signal $CH1_{N-3}$ to the switch 512.

The switch 516 opens and closes the path between the decoupling capacitor 222 and the precharge capacitor 518 in accordance with the output signal from the AND gate 519. The switch 517 opens and closes the path between the power supply terminal and the precharge capacitor 518 in accordance with the output signal from the AND gate 520. One end of the precharge capacitor 518 is grounded and the other end is connected to the switches 516 and 517.

The AND gate 519 outputs the logical product of the switching control signal $S2_{N-3}$ and the charge control signal $CH2_{N-3}$ to the switch 516. The AND gate 520 outputs the logical product of the switching control signal $S3_{N-3}$ and the charge control signal $CH2_{N-3}$ to the switch 517.

The control signal generation unit 530 controls the charge amount on the basis of the digital signals $DOUT_{N-1}$ and $DOUT_{N-2}$. The control signal generation unit 530 generates switching control signals $S2_{N-3}$ and $S3_{N-3}$ and control signals $SIP_{N-3}$ and $SIN_{N-3}$ by a circuit similar to the circuit illustrated in FIG. 21. Moreover, the control signal generation unit 530 generates the charge control signal $CH2_{N-3}$ by logical operation on the digital signals $DOUT_{N-1}$ and $DOUT_{N-2}$.

FIG. 28 is a diagram illustrating an example of operation of the control signal generation unit 530 corresponding to the (N−3)th bit according to the third embodiment of the present technology. In a case where both of the digital signals $DOUT_{N-1}$ and $DOUT_{N-2}$ are "0" or both are "1", the control signal generation unit 530 outputs the charge control signal $CH2_{N-3}$ of "0". With this configuration, precharging is performed using one precharge capacitor. In contrast, in a case where values of the digital signals $DOUT_{N-1}$ and $DOUT_{N-2}$ are different from each other, the control signal generation unit 530 outputs the charge control signal $CH2_{N-3}$ of "1". With this configuration, precharging is performed using two precharge capacitors.

Figure 29:
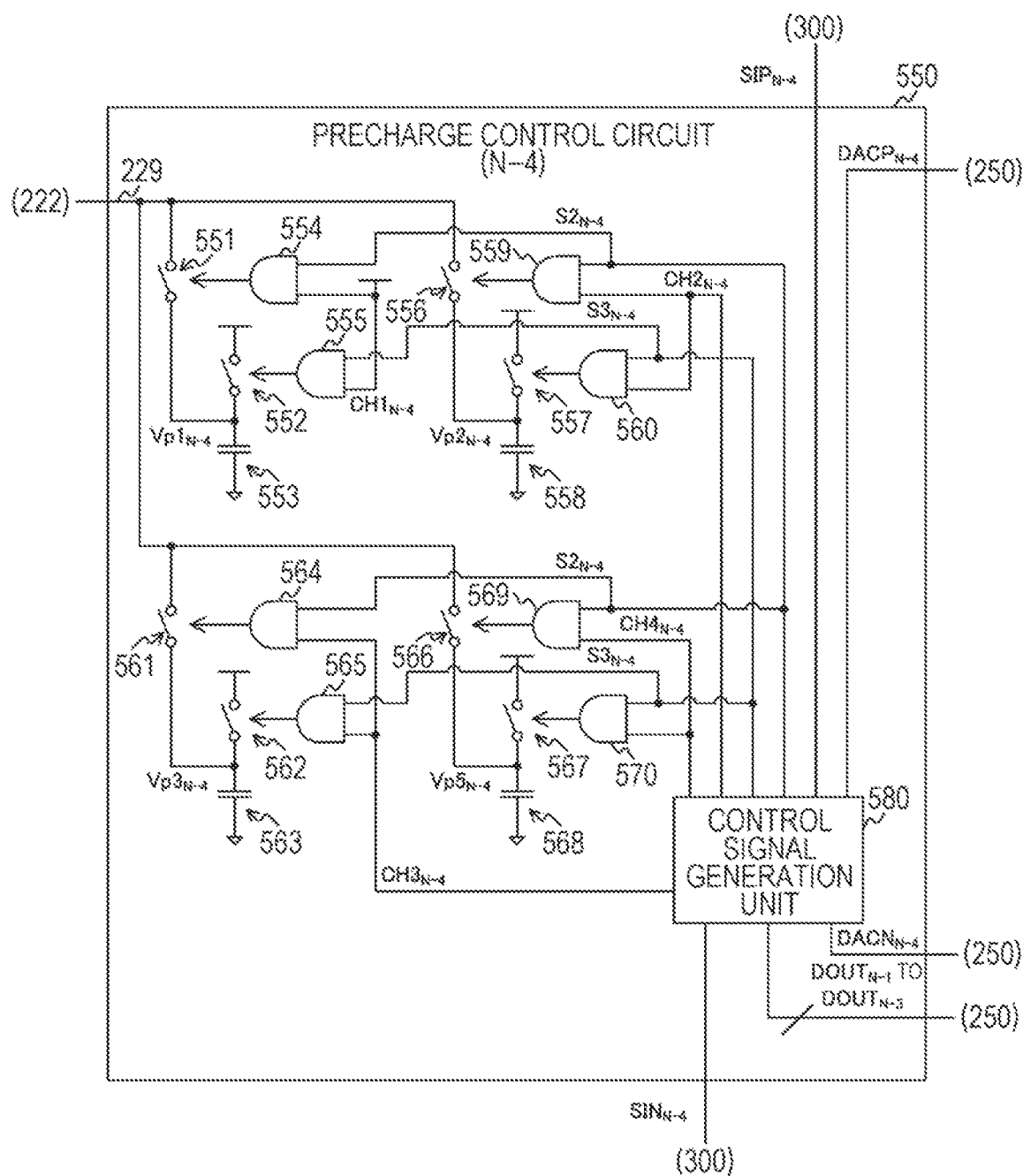
FIG. 29 is a circuit diagram illustrating a configuration example of a precharge control circuit corresponding to a (N−4)th bit according to the third embodiment of the present technology.

FIG. 29 is a circuit diagram illustrating a configuration example of a precharge control circuit 550 corresponding to a (N−4)th bit according to the third embodiment of the present technology. The precharge control circuit 550 includes switches 551, 552, 556 and 557, precharge capacitors 553 and 558, and AND gates 554, 555, 559, and 560. Furthermore, the precharge control circuit 550 includes switches 561, 562, 566 and 567, precharge capacitors 563 and 568, AND gates 564, 565, 569, and 570, and a control signal generation unit 580.

The switch 551 opens and closes a path between the decoupling capacitor 222 and the precharge capacitor 553 in accordance with the output signal from the AND gate 554. For example, the switch 551 shifts to the closed state in a case where the output signal from the AND gate 554 is at a high level, and shifts to the open state in a case where the output signal from the AND gate 554 is at a low level. Similarly, the other switches 552, 556, 557, 561, 562, 566, and 567 shift to the closed state in a case where the output signal of the corresponding logic gate is at a high level and shift to the open state in a case where the output signal of the corresponding logic gate is at a low level.

The switch 552 opens and closes the path between the power supply terminal and the precharge capacitor 553 in accordance with the output signal from the AND gate 555. One end of the precharge capacitor 553 is grounded, and the other end is connected to the switches 551 and 552.

The AND gate 554 outputs the logical product of the switching control signal $S2_{N-4}$ and a high level charge control signal $CH1_{N-4}$ to the switch 551. The AND gate 555 outputs the logical product of the switching control signals $S3_{N-4}$ and $CH1_{N-4}$ to the switch 552.

The switch 556 opens and closes the path between the decoupling capacitor 222 and the precharge capacitor 558 in accordance with the output signal from the AND gate 559. The switch 557 opens and closes the path between the power supply terminal and the precharge capacitor 558 in accordance with the output signal from the AND gate 560. One end of the precharge capacitor 558 is grounded, and the other end is connected to the switches 556 and 557.

The AND gate 559 outputs the logical product of the switching control signal $S2_{N-4}$ and the charge control signal $CH2_{N-4}$ to the switch 556. The AND gate 560 outputs the logical product of the switching control signal $S3_{N-4}$ and the charge control signal $CH2_{N-4}$ to the switch 557.

The switch 561 opens and closes the path between the decoupling capacitor 222 and the precharge capacitor 563 in accordance with the output signal from the AND gate 564. The switch 562 opens and closes the path between the power supply terminal and the precharge capacitor 563 in accordance with the output signal from the AND gate 565. One end of the precharge capacitor 563 is grounded, and the other end is connected to the switches 561 and 562.

The AND gate 564 outputs the logical product of the switching control signal $S2_{N-4}$ and the charge control signal $CH3_{N-4}$ to the switch 561. The AND gate 565 outputs the logical product of the switching control signal $S3_{N-4}$ and the charge control signal $CH3_{N-4}$ to the switch 562.

The switch 566 opens and closes the path between the decoupling capacitor 222 and the precharge capacitor 568 in accordance with the output signal from the AND gate 569. The switch 567 opens and closes the path between the power supply terminal and the precharge capacitor 568 in accordance with the output signal from the AND gate 570. One end of the precharge capacitor 568 is grounded, and the other end is connected to the switches 566 and 567.

The AND gate 569 outputs the logical product of the switching control signal $S2_{N-4}$ and the charge control signal $CH4_{N-4}$ to the switch 566. The AND gate 570 outputs the logical product of the switching control signal $S3_{N-4}$ and the charge control signal $CH4_{N-4}$ to the switch 567.

The control signal generation unit 580 controls the charge amount on the basis of the digital signals $DOUT_{N-1}$ to $DOUT_{N-3}$. The control signal generation unit 580 generates switching control signals $S2_{N-4}$, and $S3_{N-4}$ and control signals $SIP_{N-4}$ and $SIN_{N-4}$ by a circuit similar to the circuit illustrated in FIG. 21. Moreover, the control signal generation unit 580 generates the charge control signals $CH2_{N-4}$, $CH3_{N-4}$, and $CH4_{N-4}$ by logical operation on the digital signals $DOUT_{N-1}$ to $DOUT_{N-3}$.

FIG. 30 is a diagram illustrating an example of operation of the control signal generation unit 580 corresponding to the (N−4)th bit according to the third embodiment of the present technology.

In a case where the digital signal including $DOUT_{N-1}$ to $DOUT_{N-3}$ is "000", the control signal generation unit 580 sets the charge control signals $CH2_{N-4}$, $CH3_{N-4}$ and $CH4_{N-4}$ to "0". With this configuration, precharging is performed using one precharge capacitor.

In a case where the digital signal is "001", the control signal generation unit 580 sets the charge control signals $CH2_{N-4}$, $CH3_{N-4}$, and $CH4_{N-4}$ to "1". With this configuration, precharging is performed using four precharge capacitors.

In a case where the digital signal is "010", the control signal generation unit 580 sets the charge control signal $CH2_{N-4}$ alone to "1". With this configuration, precharging is performed using two precharge capacitors.

In a case where the digital signal is "011", the control signal generation unit 580 sets the charge control signals $CH2_{N-4}$ and $CH3_{N-4}$ to "1". With this configuration, precharging is performed using three precharge capacitors.

In a case where the digital signal is "100", the control signal generation unit 580 sets the charge control signals $CH2_{N-4}$ and $CH3_{N-4}$ to "1". With this configuration, precharging is performed using three precharge capacitors.

In a case where the digital signal is "101", the control signal generation unit 580 sets the charge control signal $CH2_{N-4}$ alone to "1". With this configuration, precharging is performed using two precharge capacitors.

In a case where the digital signal is "110", the control signal generation unit 580 sets the charge control signals $CH2_{N-4}$, $CH3_{N-4}$, and $CH4_{N-4}$ to "1". With this configuration, precharging is performed using four precharge capacitors.

In a case where the digital signal is "111", the control signal generation unit 580 sets the charge control signals $CH2_{N-4}$, $CH3_{N-4}$, and $CH4_{N-4}$ to "0". With this configuration, precharging is performed using one precharge capacitor.

Figure 31A:
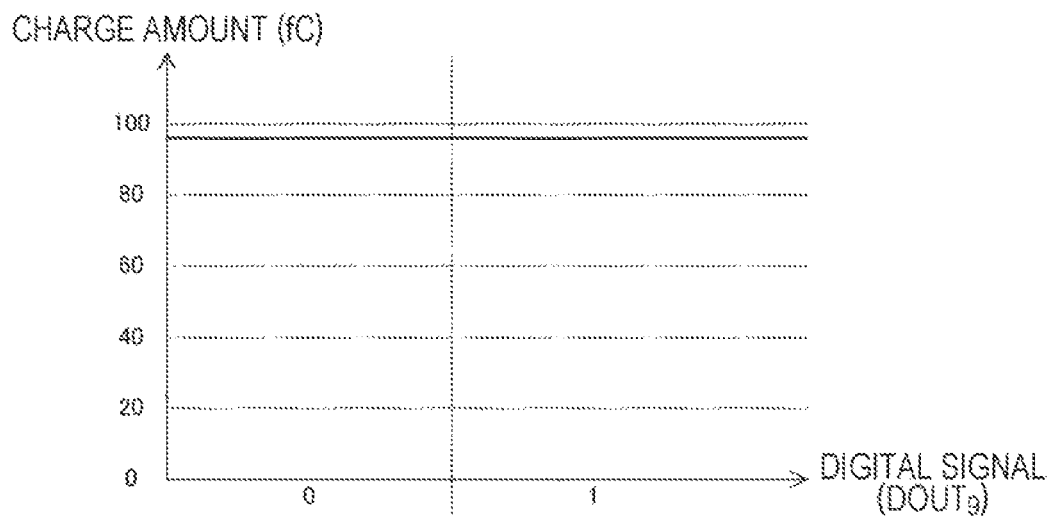
FIGS. 31A, 31B, and 31C are graphs illustrating an example of a charge fluctuation amount up to DOUT7 according to the third embodiment of the present technology.
Figure 31B:
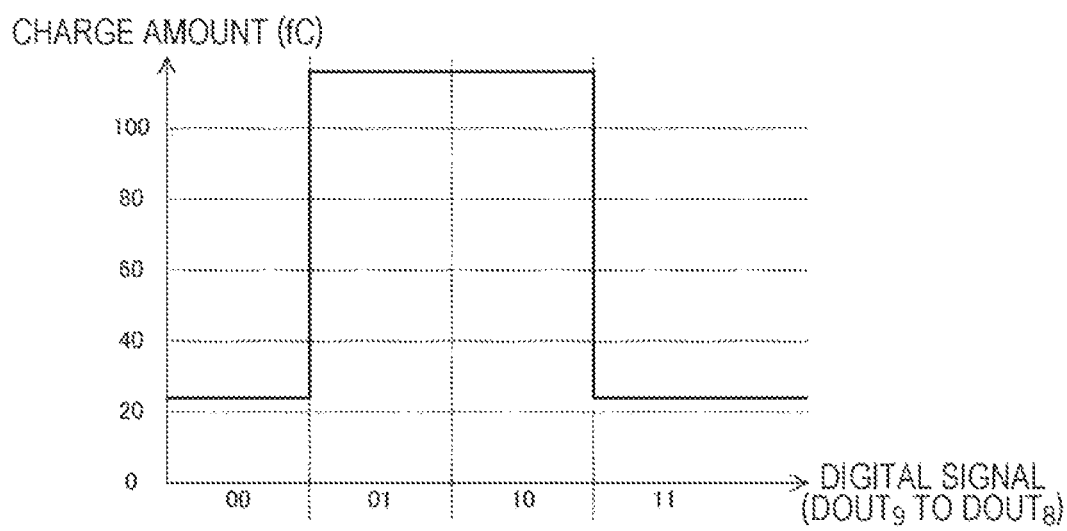
Figure 31C:
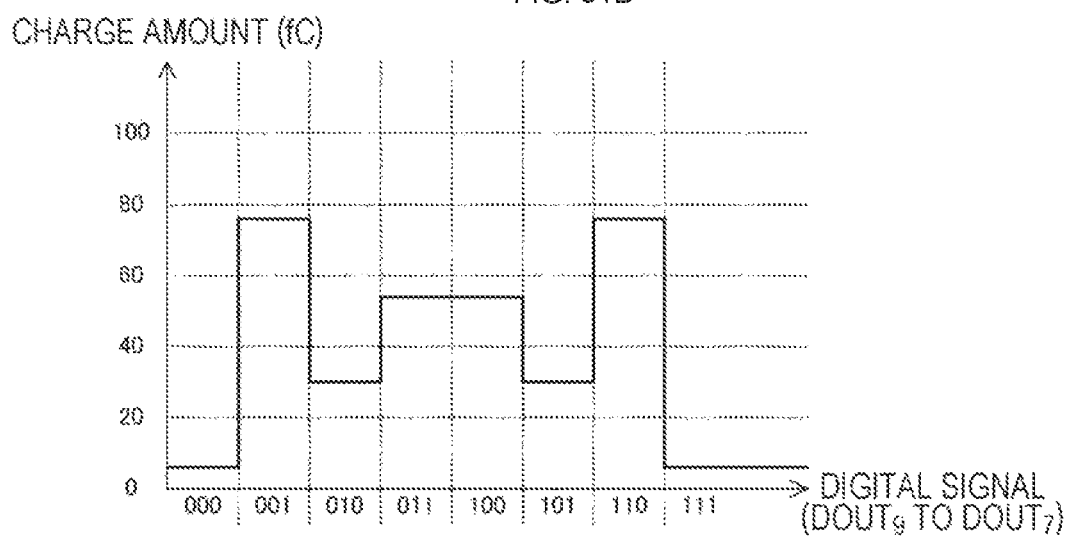

FIGS. 31A, 31B, and 31C are graphs illustrating an example of a charge fluctuation amount up to DOUT7 according to the third embodiment of the present technology. The bit length N of the digital signal DOUT is set to "10", the bit output from the comparator 230 first is defined as DOUT9, and the bit output last is defined as DOUT0.

FIG. 31A illustrates fluctuation of the charge amount when DOUT9 is output. In FIG. 31A, the vertical axis represents the charge amount to be charged and discharged, and the horizontal axis represents the value of the bit DOUT9 in the digital signal. Since the first bit (DOUT9) is generated without comparison, the charge amount would not change regardless of whether DOUT9 is "0" or "1".

FIG. 31B is a diagram illustrating fluctuation in the charge amount when the bits DOUT9 and DOUT8 are output. In FIG. 31B, the vertical axis represents the charge amount to be charged and discharged, and the horizontal axis represents the values of the bits DOUT9 and DOUT8 in the digital signal. The second bit (DOUT8) is generated after the first successive approximation control, and thus, the charge amount fluctuates in accordance with the combination of the values of the bits DOUT9 and DOUT8. The precharge control circuit 500 changes the charging amount in accordance with its fluctuation.

FIG. 31C is a diagram illustrating fluctuation in charge amount when bits DOUT9 to DOUT7 are output. In FIG. 31C, the vertical axis represents the charge amount to be charged and discharged, and the horizontal axis represents the values of the bits DOUT9 to DOUT7 in the digital signal. The third bit (DOUT8) is generated after the second successive approximation control, and thus, the charge amount fluctuates in accordance with the combination of the values of the bits DOUT9 to DOUT7. The precharge control circuit 550 changes the charging amount in accordance with the fluctuation.

Figure 32A:
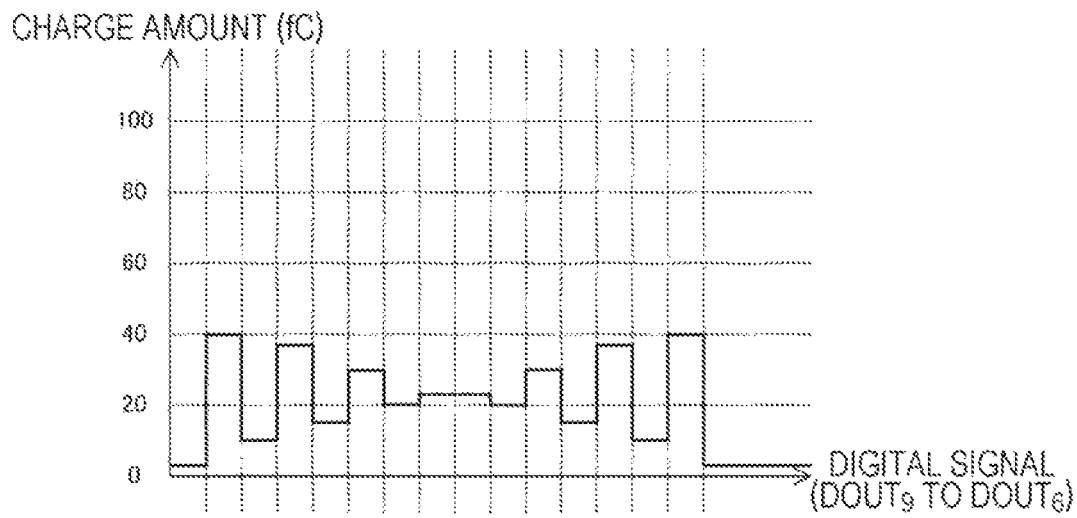
FIGS. 32A, 32B, and 32C are graphs illustrating an example of a charge fluctuation amount of DOUT6 or later according to the third embodiment of the present technology.
Figure 32B:
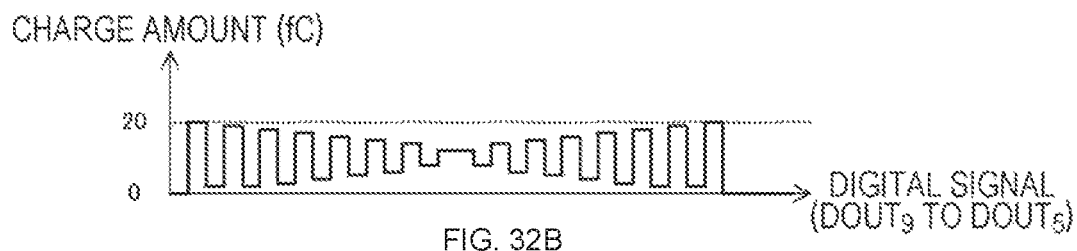
Figure 32C:
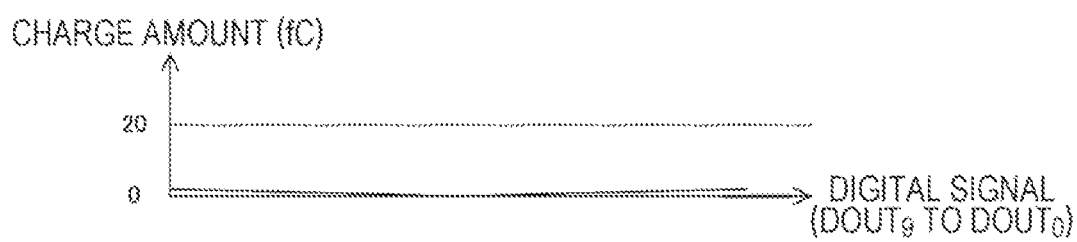

FIGS. 32A, 32B, and 32C are graphs illustrating an example of the charge fluctuation amount on DOUT6 or later according to the third embodiment of the present technology. FIG. 32A is a diagram illustrating the fluctuation of the charge amount when the bits DOUT9 to DOUT6 are output. In FIG. 32A, the vertical axis represents the charge amount to be charged and discharged, and the horizontal axis represents the values of the bits DOUT9 to DOUT6 in the digital signal.

FIG. 32B is a diagram illustrating fluctuation in charge amount when bits DOUT9 to DOUT5 are output. In FIG. 32B, the vertical axis represents the charge amount to be charged and discharged, and the horizontal axis represents the values of the bits DOUT9 to DOUT5 in the digital signal.

FIG. 32C is a diagram illustrating the fluctuation of the charge amount when all the bits are output. In FIG. 32C, the vertical axis represents the charge amount to be charged and discharged, and the horizontal axis represents the value of the digital signal.

As illustrated in FIGS. 32A, 32B, and 32C, while the charge amount fluctuates in accordance with the value of the digital signal, the amount of fluctuation is less than that at the time of output of DOUT8 and DOUT7 illustrated in FIGS. 31A, 31B, and 31C. Therefore, on DOUT6 or later, the charging amount is constant and no problem arises. Note that the charging amount may be changed in accordance with the digital signal even on DOUT6 (that is, the (N−5)th bit) or later.

In this manner, according to the third embodiment of the present technology, since the precharge control unit 400 controls the charging amount on the basis of the digital signal DOUT, it would be possible to control the charging amount to an appropriate value according to the variation even in a case where the charge amount to be charged and discharged fluctuates.

Application Example

"Power Storage System in Residence, as Application Example"

Figure 33:
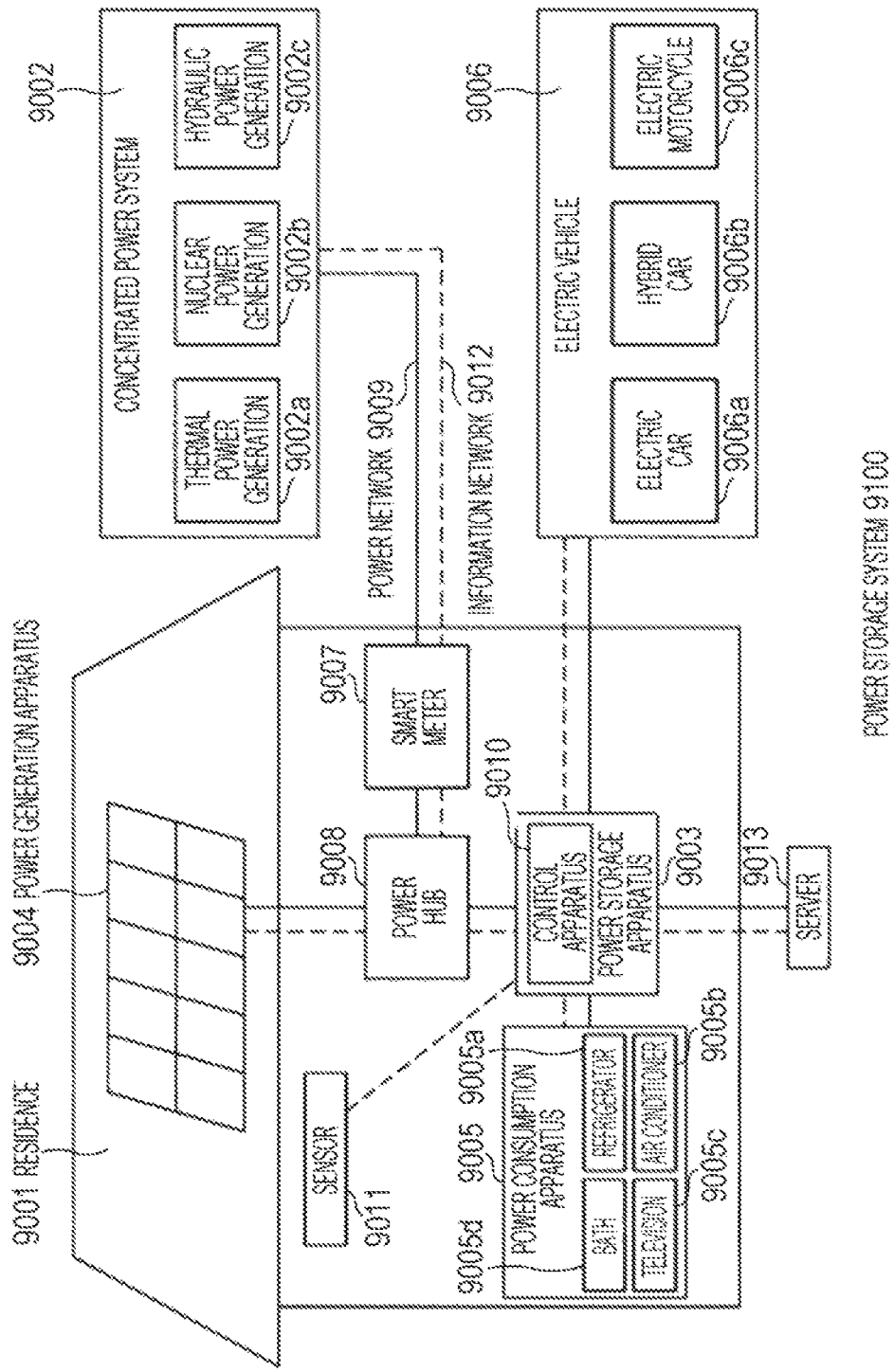
FIG. 33 is a block diagram illustrating a configuration example of a power storage system for residential use.

Exemplary application of the present disclosure to a power storage system for a residence will be described with reference to FIG. 33. For example, in a power storage system 9100 for a residence 9001, power is supplied to a power storage apparatus 9003 from a concentrated power system 9002 including a thermal power generation 9002a, a nuclear power generation 9002b, a hydraulic power generation 9002c, and the like, over a power network 9009, an information network 9012, a smart meter 9007, a power hub 9008, or the like.

Together with this, power is supplied to the power storage apparatus 9003 from an independent power source such as a residence-based power generation apparatus 9004. The supplied power is stored in the power storage apparatus 9003. The power to be used in the residence 9001 is supplied using the power storage apparatus 9003. A similar power storage system can be used not only in the residence 9001 but also in a building The residence 9001 includes the power generation apparatus 9004, a power consumption apparatus 9005, the power storage apparatus 9003, a control apparatus 9010 that controls individual apparatuses, the smart meter 9007, and a sensor 9011 that obtains various types of information. The individual apparatuses are connected over the power network 9009 and the information network 9012. A solar battery, a fuel battery, or the like, are used as the power generation apparatus 9004, and the generated power is supplied to the power consumption apparatus 9005 and/or the power storage apparatus 9003. The power consumption apparatus 9005 is a refrigerator 9005a, an air conditioner 9005b, a television receiver 9005c, a bath 9005d, or the like. Moreover, the power consumption apparatus 9005 includes an electric vehicle 9006. The electric vehicle 9006 is an electric car 9006a, a hybrid car 9006b, and an electric motorcycle 9006c.

The battery unit of the present disclosure described above is applied to the power storage apparatus 9003. The power storage apparatus 9003 is configured with a rechargeable battery or a capacitor. For example, the power storage apparatus 9003 is configured with a lithium ion battery. The lithium ion battery may be a stationary type or may be one used in the electric vehicle 9006. The smart meter 9007 has a function of measuring usage of commercial power and transmitting the measured usage to an electric power company. The power network 9009 may be any one of DC power supply, AC power supply, and noncontact power supply, or a combination of a plurality of these.

The exemplary various sensors 9011 include a human sensor, an illumination sensor, an object detection sensor, a power consumption sensor, a vibration sensor, a contact sensor, a temperature sensor, an infrared sensor, and the like. The information obtained by the various sensors 9011 is transmitted to the control apparatus 9010. Weather conditions, human conditions, or the like, are known by the information from the sensors 9011, and accordingly, it is possible to automatically control the power consumption apparatus 9005 so as to minimize energy consumption. Moreover, the control apparatus 9010 can transmit information related to the residence 9001 to an external electric power company, or the like, over the Internet.

The power hub 9008 performs processing of power line branching, DC-AC conversion, or the like. Communication systems of the information network 9012 connected to the control apparatus 9010 include a method of using a communication interface such as a universal asynchronous receiver-transmitter (UART): transmission and reception circuit for asynchronous serial communication, and a method of using a sensor network by a wireless communication standard such as Bluetooth (registered trademark), ZigBee, and Wi-Fi. The Bluetooth system is applied to multimedia communication and enables communication involving one-to-many connection. The ZigBee uses a physical layer of Institute of Electrical and Electronics Engineers (IEEE) 802.15.4. The IEEE 802.15.4 is a name of a short-distance wireless network standard referred to as Personal Area Network (PAN) or Wireless (W) PAN.

The control apparatus 9010 is connected to an external server 9013. The server 9013 may be managed by any of the residence 9001, an electric power company, and a service provider. The information transmitted and received by the server 9013 include power consumption information, life pattern information, power rates, weather information, natural disaster information, and information regarding power transaction, for example. Such information may be transmitted and received by a residence-based power consumption apparatus (a television receiver, for example), and may be transmitted and received by an apparatus outside the residence (e.g., a cellular phone and the like). Such information may be displayed on a device having a display function, e.g., a television receiver, a cellular phone, a personal digital assistant (PDA), or the like.

The control apparatus 9010 configured to control individual components includes a central processing unit (CPU), a random access memory (RAM), a read only memory (ROM), and the like, and is stored in the power storage apparatus 9003 in the present example. The control apparatus 9010 is connected to the power storage apparatus 9003, the residence-based power generation apparatus 9004, the power consumption apparatus 9005, the various sensors 9011, and the server 9013 over the information network 9012, and has a function of adjusting usage of commercial power and a power generation amount, for example. Note that the control apparatus 9010 may have an additional function of performing power transaction in the power market, or the like.

As described above, not only the power from the concentrated power system 9002 such as the thermal power 9002a, the nuclear power generation 9002b, and the hydraulic power generation 9002c but also power generated by the residence-based power generation apparatus 9004 (solar power generation, wind power generation) can be stored in the power storage apparatus 9003. Therefore, even when the power generated by the residence-based power generation apparatus 9004 fluctuates, it is possible to perform control of keeping electric energy transmitted to the outside constant or discharging only a required amount. For example, it is also possible to employ a form of use in which power obtained by solar power generation is stored in the power storage apparatus 9003 and, together with this, midnight power that is low in cost during night is stored in the power storage apparatus 9003 and the power stored by the power storage apparatus 9003 is discharged to be used in the daytime time zone when the cost is high.

Note that although the present example describes the case in which the control apparatus 9010 is stored in the power storage apparatus 9003, the control apparatus 9010 may be stored in the smart meter 9007 or may be configured independently. Moreover, the power storage system 9100 may be used for a plurality of residences in a collective residence, as a target, or may be used for a plurality of detached residences, as a target.

An example of the power storage system 9100 to which the technique according to the present disclosure can be applied has been described above. The technology according to the present disclosure can be suitably applied to the sensor 9011 out of the above-described configuration. Specifically, the analog-to-digital converter 200 illustrated in FIG. 2 is applied to the ADC in the sensor 9011. With application of the technology according to the present disclosure to the sensor 9011, it is possible to reduce the power consumption of the sensor 9011.

Note that the above-described embodiment illustrates an example for embodying the present technology, and the matter of the embodiments corresponds to the subject matter of the invention included in the appended claims. Similarly, the subject matter of the invention included in the appended claims corresponds to the matter under the same names as the matter in the embodiments of the present technology. The present technology, however, is not limited to the embodiments, and various modifications can be made to the embodiments without departing from the scope of the technology.

Furthermore, the processing procedure in the above-described embodiments may be regarded as a method including these series of procedures, and as a program for causing a computer to execute these series of procedures or as a recording medium storing the program. This recording medium can be a compact disc (CD), a mini disc (MD), a digital versatile disc (DVD), a memory card, a Blu-ray (registered trademark) disc, or the like, for example.

Note that effects described here in the present description are provided for purposes of exemplary illustration and are not intended to be limiting. Still other effects may also be contemplated.

Note that the present technology may also be configured as below.

(1) An analog-to-digital converter including:
a pair of sampling capacitors that samples a single-ended signal;
a connection control unit that, after the single-ended signal has been sampled, performs positive-side connection control of connecting both ends of one of the pair of sampling capacitors across a positive-side signal line and a predetermined terminal and performs negative-side connection control of connecting both ends of the other of the pair of sampling capacitors across a negative-side signal line and the predetermined terminal; and
a conversion unit that converts a differential signal from the positive-side signal line and the negative-side signal line that have respectively undergone the positive-side connection control and the negative-side connection control into a digital signal.

(2) The analog-to-digital converter according to (1), further including a pair of common voltage generating capacitors charged with a predetermined internal potential, in which the pair of sampling capacitors samples the single-ended signal in a state where the capacitor is connected in parallel between the positive-side signal line and the negative-side signal line,
the positive-side connection control is a control of switching a connection destination of one end of the one of the pair of sampling capacitors from the negative-side signal line to the predetermined terminal and switching a connection destination of one end of the one of the pair of common voltage generating capacitors from the predetermined internal potential to the positive-side signal line, and
the negative-side connection control is a control of switching a connection destination of one end of the other of the pair of sampling capacitors from the positive-side signal line to the predetermined terminal and switching a connection destination of one end of the other of the pair of common voltage generating capacitors from the predetermined internal potential to the negative-side signal line.

(3) The analog-to-digital converter according to (2),
in which the connection control unit switches a connection destination of the one end of the other of the pair of sampling capacitors at a timing different from the one of the pair of sampling capacitors.

(4) The analog-to-digital converter according to (1), further including a pair of common voltage generating capacitors charged with a potential of the negative-side signal line,
in which the one of the pair of sampling capacitors samples the single-ended signal in a state where the both ends are connected to the positive-side signal line and the predetermined terminal,
the other of the pair of sampling capacitors samples the single-ended signal in a state where the both ends are connected to the positive-side signal line and the predetermined internal potential,
the positive-side connection control is a control of switching a connection destination of one end of one of the pair of common voltage generating capacitors from the negative-side signal line to the positive-side signal line, and
the negative-side connection control is a control of switching a connection destination of one end of the other of the pair of sampling capacitors from the positive-side signal line to the predetermined terminal and switching a connection destination of the other end of the other of the pair of sampling capacitors from the predetermined internal potential to the negative-side signal line.

(5) The analog-to-digital converter according to any of (1) to (4), further including:
a decoupling capacitor that supplies a reference potential higher than a predetermined ground potential via a reference signal line;
a digital-to-analog converter control unit that generates a control signal of instructing switching a connection destination of one end of any of the pair of sampling capacitors from one of the reference potential and the ground potential to the other on the basis of the digital signal;
a charge control unit that outputs the control signal after charging at least one of the decoupling capacitor or the reference signal line in a case where the control signal has been generated; and
a switch that switches a connection destination of the one end of any of the pair of sampling capacitors in accordance with the output control signal.

(6) The analog-to-digital converter according to (5),
in which the charge control unit charges at least one of the decoupling capacitor or the reference signal line with a constant charging amount.

(7) The analog-to-digital converter according to (5),
in which the charge control unit controls the charging amount in charging at least one of the decoupling capacitor or the reference signal line on the basis of the digital signal.

(8) The analog-to-digital converter according to any of (1) to (7),
in which the single-ended signal is input to a top plate of the pair of sampling capacitors.

(9) The analog-to-digital converter according to any of (1) to (7),
in which the single-ended signal is input to a bottom plate of the pair of sampling capacitors.

(10) An electronic device including:
a pair of sampling capacitors that samples a single-ended signal;
a connection control unit that, after the single-ended signal has been sampled, performs positive-side connection control of connecting both ends of one of the pair of sampling capacitors across a positive-side signal line and a predetermined terminal and performs negative-side connection control of connecting both ends of the other of the pair of sampling capacitors across a negative-side signal line and the predetermined terminal;
a conversion unit that converts a differential signal from the positive-side signal line and the negative-side signal line that have respectively undergone the positive-side connection control and the negative-side connection control into a digital signal; and
a digital signal processing unit that processes the digital signal.

(11) A method for controlling an analog-to-digital converter, the method including:
- a control step of performing, after a single-ended signal has been sampled to a pair of sampling capacitors, positive-side connection control of connecting both ends of one of the pair of sampling capacitors across a positive-side signal line and a predetermined terminal and performing negative-side connection control of connecting both ends of the other of the pair of sampling capacitors across a negative-side signal line and the predetermined terminal; and
- a converting step of converting a differential signal from the positive-side signal line and the negative-side signal line that have respectively undergone the positive-side connection control and the negative-side connection control into a digital signal.

REFERENCE SIGNS LIST

100 Electronic device
110 Single-ended signal supply unit
120 Sampling clock generation circuit
130 Digital signal processing unit
141, 142 Resistor
200 Analog-to-digital converter
211, 212 Sampling switch
221 Reference buffer
222 Decoupling capacitor
230 Comparator
240, 241, 242 Successive approximation control unit
250 DAC control unit
300 Digital-to-analog conversion unit
310 Circuit block
214, 215, 311, 313, 314, 315, 316, 318, 319, 320, 321, 323, 324, 325, 326, 328, 329, 330, 331, 332, 341, 342, 343, 344, 411, 412, 511, 512, 516, 517, 551, 552, 556, 557, 561, 562, 566, 567 Switch
312, 322 Common voltage generating capacitor
317, 327 Sampling capacitor
391, 392 Capacitor
400 Precharge control unit
410, 500, 550 Precharge control circuit
413, 513, 518, 553, 558, 563, 568 Precharge capacitor
420, 530, 580 Control signal generation unit
421, 422, 514, 515, 519, 520, 554, 555, 559, 560, 564, 565, 569, 570 AND gate
423, 424, 425, 426, 427, 428, 431 NOT gate
429, 430, 432 NOR gate

The invention claimed is:

1. An analog-to-digital converter, comprising:
- a pair of sampling capacitors configured to sample a single-ended signal based on a connection of the pair of sampling capacitors between a positive-side signal line and a negative-side signal line,
  - wherein the connection of the pair of sampling capacitors between the positive-side signal line and the negative-side signal line is in parallel;
- a connection control unit, based on the sampled single-ended signal, configured to:
  - positive-side connection control for connection of both ends of a first sampling capacitor of the pair of sampling capacitors across the positive-side signal line and a specific terminal, and
  - negative-side connection control for connection of both ends of a second sampling capacitor of the pair of sampling capacitors across the negative-side signal line and the specific terminal;
- a conversion unit configured to convert a differential signal from the positive-side signal line and the negative-side signal line, that have respectively undergone the positive-side connection control and the negative-side connection control, into a digital signal; and
- a pair of common voltage generating capacitors charged with a specific internal potential, wherein
  - the positive-side connection control comprises
    - switch of a connection destination of one end of the first sampling capacitor from the negative-side signal line to the specific terminal, and
    - switch of a connection destination of one end of a first common voltage generating capacitor of the pair of common voltage generating capacitors from the specific internal potential to the positive-side signal line, and
  - the negative-side connection control comprises
    - switch of a connection destination of one end of the second sampling capacitor from the positive-side signal line to the specific terminal, and
    - switch of a connection destination of one end of a second common voltage generating capacitor of the pair of common voltage generating capacitors from the specific internal potential to the negative-side signal line.

2. The analog-to-digital converter according to claim 1, wherein the connection control unit is further configured to switch the connection destination of the one end of the second sampling capacitor at a timing different from a timing of the switch of the connection destination of the one end of the first sampling capacitor.

3. The analog-to-digital converter according to claim 1, wherein
- the pair of common voltage generating capacitors is charged with a potential of the negative-side signal line,
- the first sampling capacitor is configured to sample the single-ended signal in a state where the both ends of the first sampling capacitor are connected to the positive-side signal line and the specific terminal,
- the second sampling capacitor is configured to sample the single-ended signal based on a connection of the second sampling capacitor with the positive-side signal line and the specific internal potential,
- the positive-side connection control comprises switch of the connection destination of the one end of the first common voltage generating capacitor from the negative-side signal line to the positive-side signal line, and
- the negative-side connection control comprises
  - switch of the connection destination of an end of the second sampling capacitor from the specific internal potential to the negative-side signal line.

4. The analog-to-digital converter according to claim 1, further comprising:
- a decoupling capacitor configured to supply a reference potential via a reference signal line;
- a digital-to-analog converter control unit configured to generate a control signal based on a basis of the digital signal,
  - wherein the control signal includes an instruction to switch the connection destination, of the one end of one of the first sampling capacitor or the second sampling capacitor, from one of the reference potential or a ground potential to other of the reference potential or the ground potential;

a charge control unit configured to output the control signal after charge of at least one of the decoupling capacitor or the reference signal line, when the control signal is generated; and a switch configured to switch, based on the output control signal, one of the connection destination of the one end of the first sampling capacitor or the connection destination of the one end of the second sampling capacitor.

5. The analog-to-digital converter according to claim 4, wherein the charge control unit is configured to charge at least one of the decoupling capacitor or the reference signal line with a constant charging amount.

6. The analog-to-digital converter according to claim 4, wherein the charge control unit is further configured to control a charging amount of the at least one of the decoupling capacitor or the reference signal line, based on the digital signal.

7. The analog-to-digital converter according to claim 1, wherein the single-ended signal is input to a top plate of the pair of sampling capacitors.

8. The analog-to-digital converter according to claim 1, wherein the single-ended signal is input to a bottom plate of the pair of sampling capacitors.

9. An electronic device, comprising:
a pair of sampling capacitors configured to sample a single-ended signal based on a connection of the pair of sampling capacitors between a positive-side signal line and a negative-side signal line,
wherein the connection of the pair of sampling capacitors between the positive-side signal line and the negative-side signal line is in parallel;
a connection control unit, based on the sampled single-ended signal, configured to:
positive-side connection control for connection of both ends of a first sampling capacitor of the pair of sampling capacitors across the positive-side signal line and a specific terminal, and
negative-side connection control for connection of both ends of a second sampling capacitor of the pair of sampling capacitors across the negative-side signal line and the specific terminal;
a conversion unit configured to convert a differential signal from the positive-side signal line and the negative-side signal line, that have respectively undergone the positive-side connection control and the negative-side connection control, into a digital signal;
a digital signal processing unit configured to process the digital signal; and
a pair of common voltage generating capacitors charged with a specific internal potential, wherein
the positive-side connection control comprises
switch of a connection destination of one end of the first sampling capacitor from the negative-side signal line to the specific terminal, and
switch of a connection destination of one end of a first common voltage generating capacitor of the pair of common voltage generating capacitors from the specific internal potential to the positive-side signal line, and
the negative-side connection control comprises
switch of a connection destination of one end of the second sampling capacitor from the positive-side signal line to the specific terminal, and
switch of a connection destination of one end a second common voltage generating capacitor of the pair of common voltage generating capacitors from the specific internal potential to the negative-side signal line.

10. A method for controlling an analog-to-digital converter, the method comprising:
sampling a single-ended signal based on a connection of a pair of sampling capacitors between a positive-side signal line and a negative-side signal line,
wherein the connection of the pair of sampling capacitors between the positive-side signal line and the negative-side signal line is in parallel;
positive-side connection controlling, based on the sampled single-ended signal, of connecting both ends of a first sampling capacitor of the pair of sampling capacitors across the positive-side signal line and a specific terminal; and
negative-side connection controlling, based on the sampled single-ended signal, of connecting both ends of a second sampling capacitor of the pair of sampling capacitors across the negative-side signal line and the specific terminal; and
converting a differential signal from the positive-side signal line and the negative-side signal line, that have respectively undergone the positive-side connection control and the negative-side connection control, into a digital signal,
the positive-side connection control comprises
switching a connection destination of one end of the first sampling capacitor from the negative-side signal line to the specific terminal, and
switching a connection destination of one end of a first common voltage generating capacitor of a pair of common voltage generating capacitors from a specific internal potential to the positive-side signal line, and
the negative-side connection control comprises
switching a connection destination of one end of the second sampling capacitor from the positive-side signal line to the specific terminal, and
switching a connection destination of one end of a second common voltage generating capacitor of the pair of common voltage generating capacitors from the specific internal potential to the negative-side signal line.

* * * * *